United States Patent
Elberbaum

(10) Patent No.: US 9,541,911 B2
(45) Date of Patent: Jan. 10, 2017

(54) METHOD AND APPARATUS FOR SETTING AND INTEGRATING HOME AUTOMATION GRID OR NETWORK WITH ELECTRICAL GRID

(71) Applicant: Elbex Video Ltd., Tokyo (JP)

(72) Inventor: David Elberbaum, Tokyo (JP)

(73) Assignee: ELBEX VIDEO LTD., Tokyo (JP)

( * ) Notice: Subject to any disclaimer, the term of this patent is extended or adjusted under 35 U.S.C. 154(b) by 0 days.

(21) Appl. No.: 14/931,176

(22) Filed: Nov. 3, 2015

(65) Prior Publication Data

US 2016/0054717 A1 Feb. 25, 2016

Related U.S. Application Data

(62) Division of application No. 14/225,948, filed on Mar. 26, 2014, now Pat. No. 9,219,358.

(51) Int. Cl.

| H05K 7/00 | (2006.01) |
|---|---|
| H05K 5/00 | (2006.01) |
| G11B 33/02 | (2006.01) |
| G05B 15/02 | (2006.01) |
| H02G 3/18 | (2006.01) |
| H05K 5/02 | (2006.01) |

(52) U.S. Cl.
CPC ............... *G05B 15/02* (2013.01); *H02G 3/18* (2013.01); *H05K 5/0017* (2013.01); *H05K 5/0247* (2013.01); *Y10T 29/49117* (2015.01)

(58) Field of Classification Search
CPC ............... H05K 5/00; H05K 7/00; H01H 9/02
USPC ........................................................ 361/819
See application file for complete search history.

(56) References Cited

U.S. PATENT DOCUMENTS

| 5,923,363 A | 7/1999 | Elberbaum |
|---|---|---|
| 6,603,842 B2 | 8/2003 | Elberbaum |
| 6,940,957 B2 | 9/2005 | Elberbaum |
| 7,461,012 B2 | 12/2008 | Elberbaum |
| 7,639,907 B2 | 12/2009 | Elberbaum |
| 7,649,727 B2 | 1/2010 | Elberbaum |

(Continued)

OTHER PUBLICATIONS

Specification and Drawings for U.S. Appl. No. 14/045,877 filed on Oct. 4, 2013.

(Continued)

*Primary Examiner* — Jerry Wu
(74) *Attorney, Agent, or Firm* — Katten Muchin Rosenman LLP

(57) ABSTRACT

A method and apparatus for setting and integrating home automation grid with an electrical grid of a residence and commercial unit by structurally connecting intelligent support boxes of electrical wiring devices comprising AC outlet, switch, relay, hybrid switch-relay and hybrid switch of the wiring device attached into the intelligent support box. The box including intelligent control and communication circuits including RF, RFID, optical via plastic optical fiber and IR in line of sight for communicating commands and control including power consumption reporting from every outlet and switch. The power outlets include accesses for introduction of RFID sensor or optical sensor for identifying the appliance or the load powered via the outlet and communicating with the load or appliance by variety of signal used in the home automation grid and protocols including optical via cascading optical cable grid.

20 Claims, 15 Drawing Sheets

(56) References Cited

U.S. PATENT DOCUMENTS

| | | |
|---|---|---|
| 7,864,500 B2 | 1/2011 | Elberbaum |
| 7,973,647 B2 | 7/2011 | Elberbaum |
| 8,006,105 B1 | 8/2011 | Sivertsen |
| 8,041,221 B2 | 10/2011 | Elberbaum |
| 8,117,076 B2 | 2/2012 | Elberbaum |
| 8,148,921 B2 | 4/2012 | Elberbaum |
| 8,170,722 B1 | 5/2012 | Elberbaum |
| 8,175,463 B2 | 5/2012 | Elberbaum |
| 8,269,376 B1 | 9/2012 | Elberbaum |
| 8,331,794 B2 | 12/2012 | Elberbaum |
| 8,331,795 B2 | 12/2012 | Elberbaum |
| 8,340,527 B2 | 12/2012 | Elberbaum |
| 8,344,668 B2 | 1/2013 | Elberbaum |
| 8,384,249 B2 | 2/2013 | Elberbaum |
| 8,441,824 B2 | 5/2013 | Elberbaum |
| 8,442,792 B1 | 5/2013 | Elberbaum |
| 8,489,469 B1 | 7/2013 | Elberbaum |
| 8,594,965 B1 | 11/2013 | Elberbaum |
| 8,638,087 B2 | 1/2014 | Elberbaum |
| 8,639,465 B1 | 1/2014 | Elberbaum |
| 2008/0258563 A1 | 10/2008 | Hodges |
| 2010/0053838 A1 | 3/2010 | Elberbaum |
| 2010/0226100 A1* | 9/2010 | Johnson .................. G06F 1/181 361/730 |
| 2010/0240249 A1* | 9/2010 | Kruse ..................... H02G 3/18 439/535 |
| 2011/0203828 A1 | 8/2011 | Alderson et al. |
| 2011/0203838 A1 | 8/2011 | MacDougall et al. |
| 2012/0262006 A1 | 10/2012 | Elberbaum |
| 2013/0183043 A1 | 7/2013 | Elberbaum |

OTHER PUBLICATIONS

Specification and Drawings for U.S. Appl. No. 14/093,966 filed on Dec. 2, 2013.
Specification and Drawings for U.S. Appl. No. 14/143,133 filed on Dec. 30, 2013.
International Search Report and Written Opinion of the International Searching Authority dated Jun. 18, 2015 from corresponding International Application No. PCT/US2015/017751.
U.S. Office Action dated Aug. 24, 2015 from corresponding U.S. Appl. No. 14/225,948.
International Preliminary Report on Patentability dated Sep. 27, 2016, from the corresponding PCT/US2015/017751.

* cited by examiner

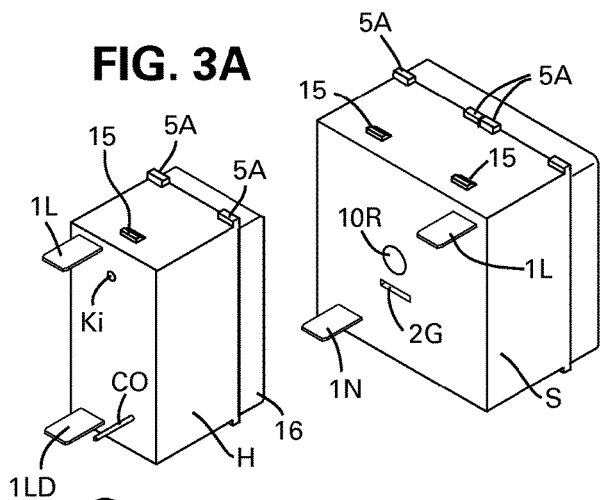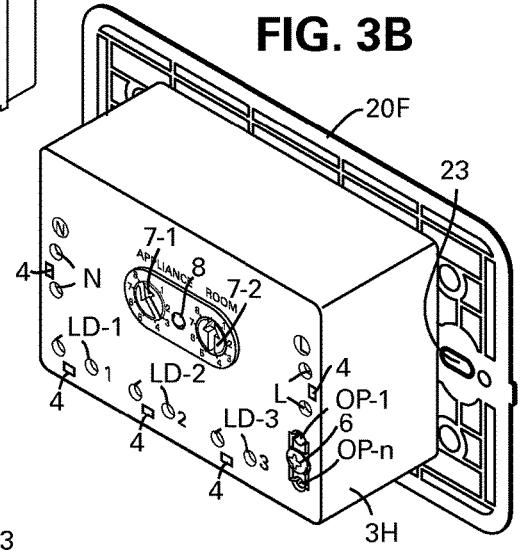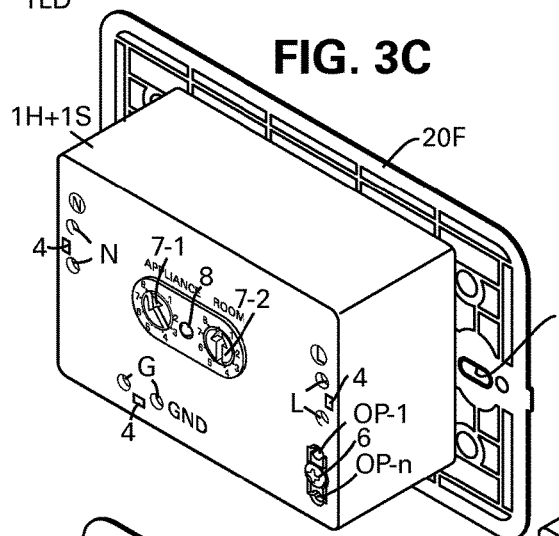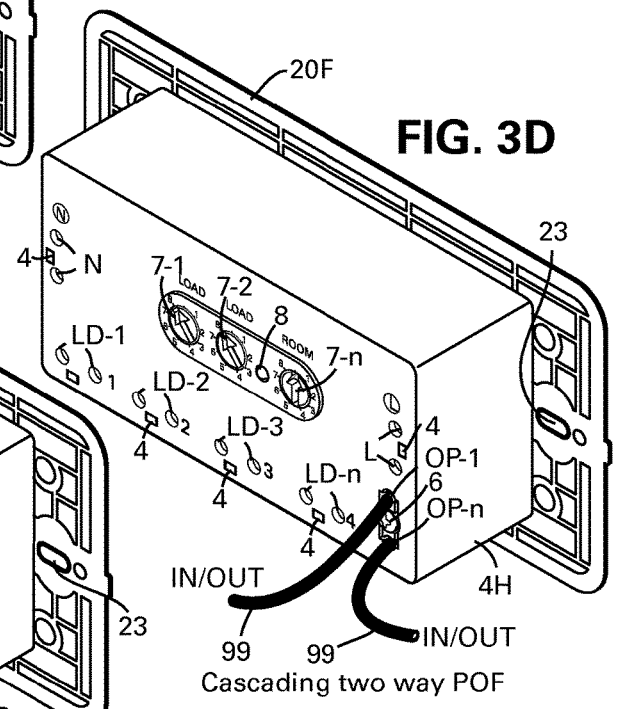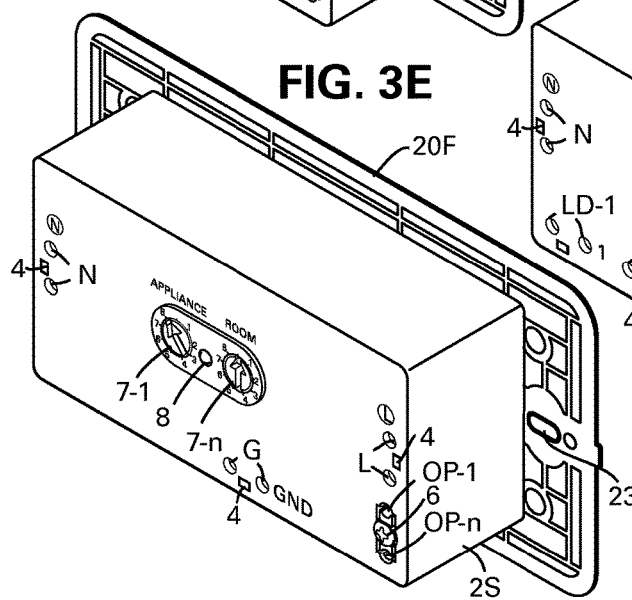

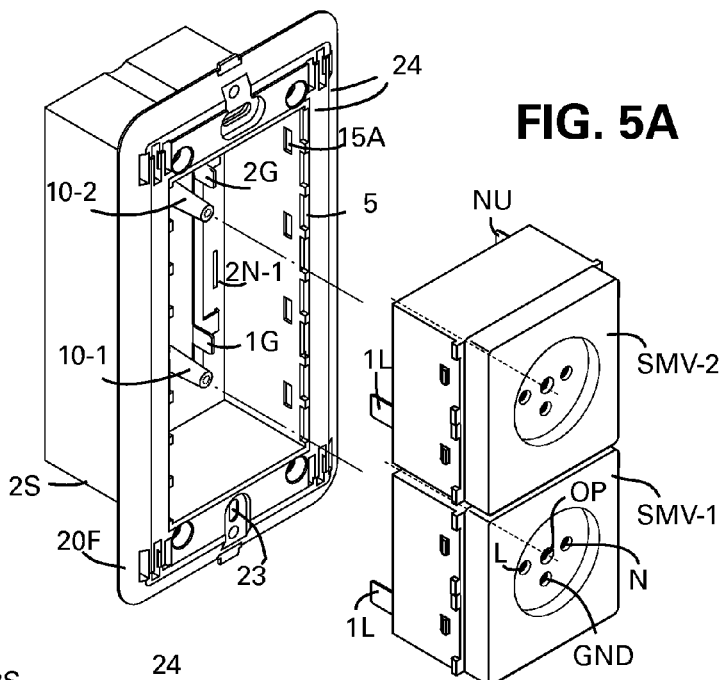
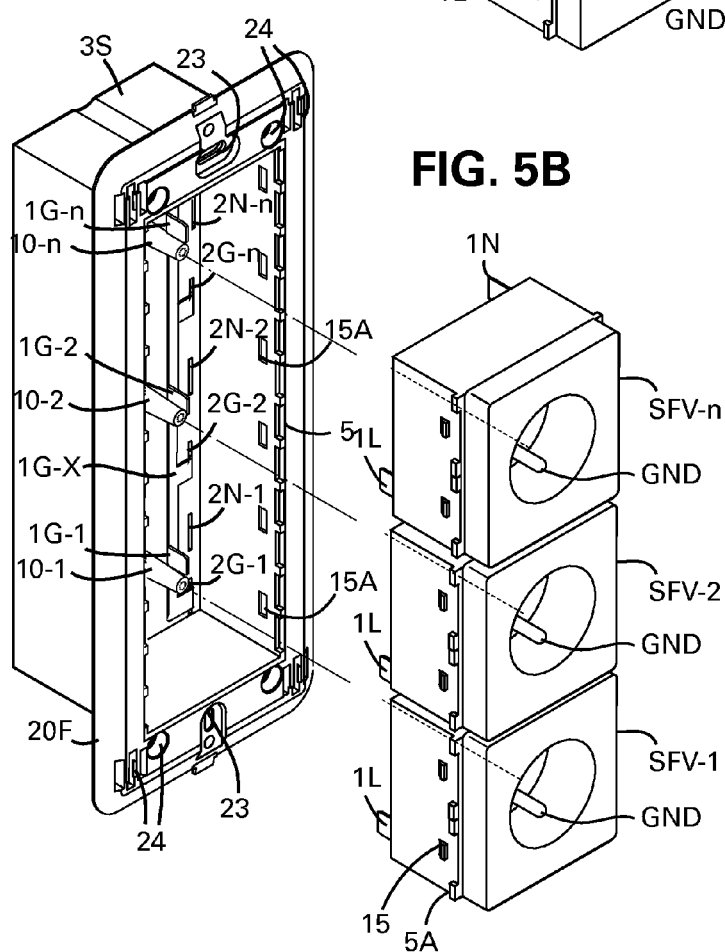
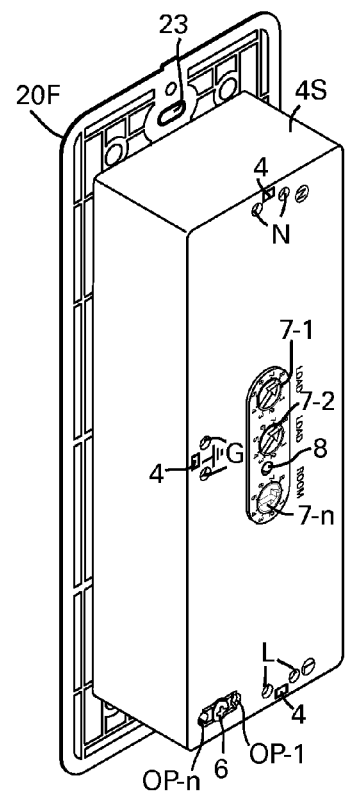
FIG. 5A
FIG. 5B
FIG. 5C

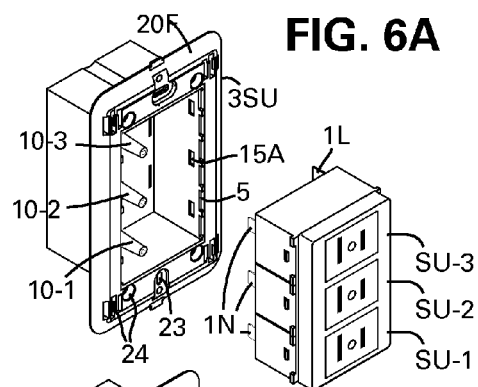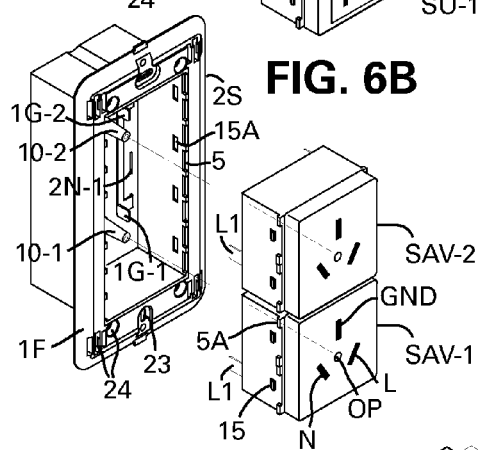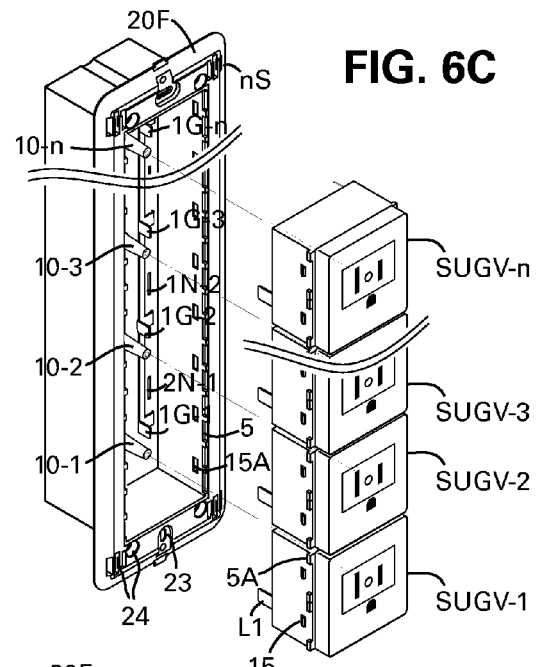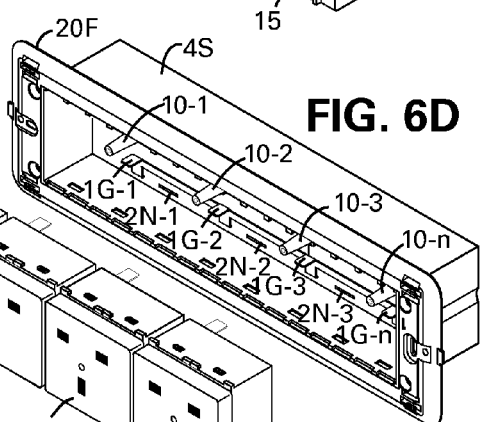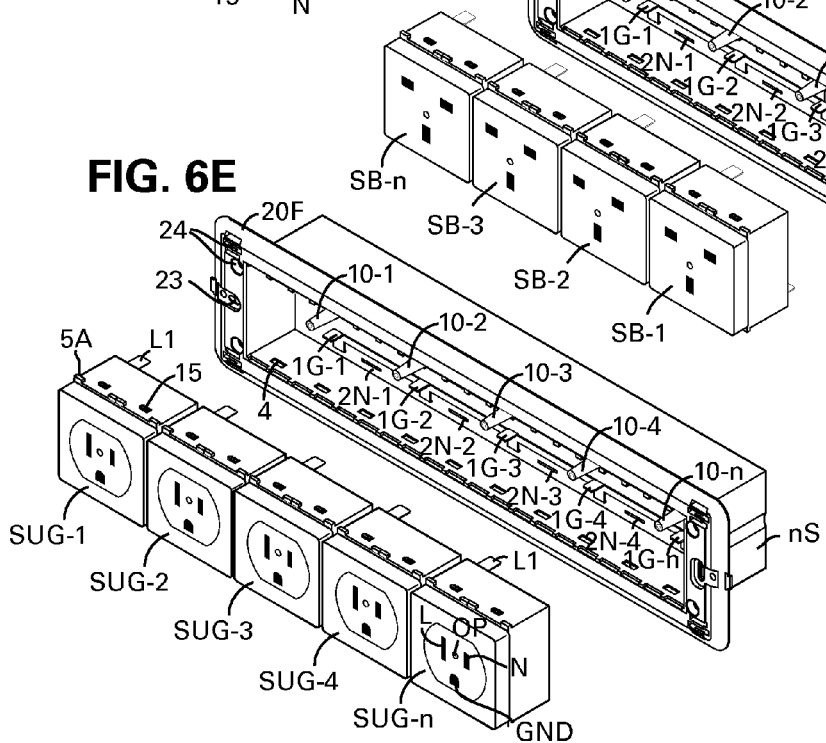

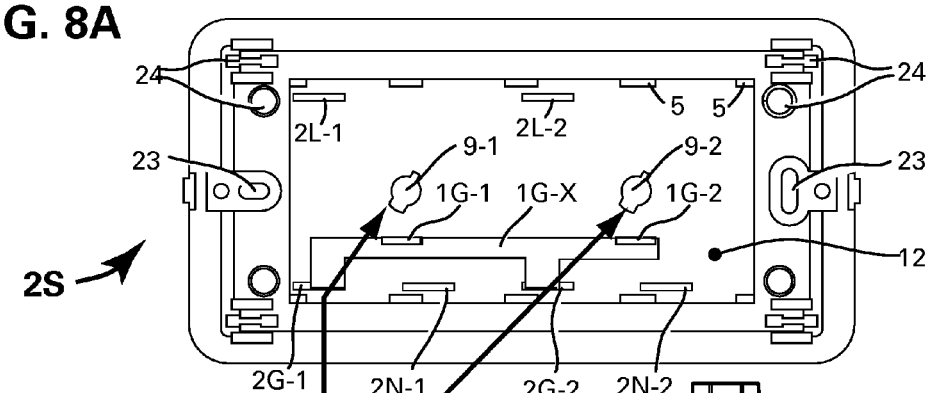
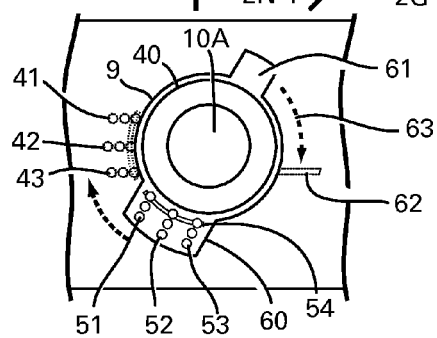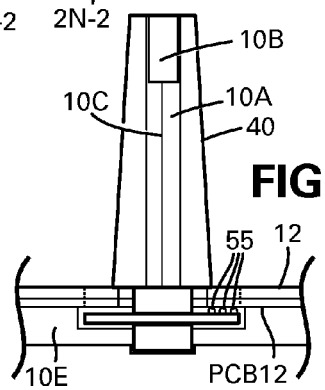
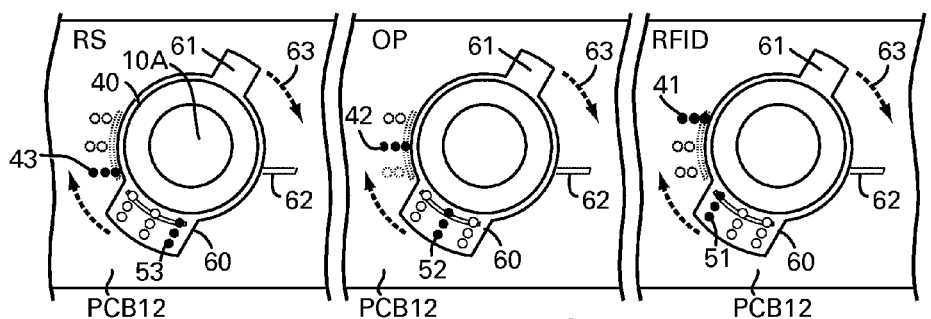
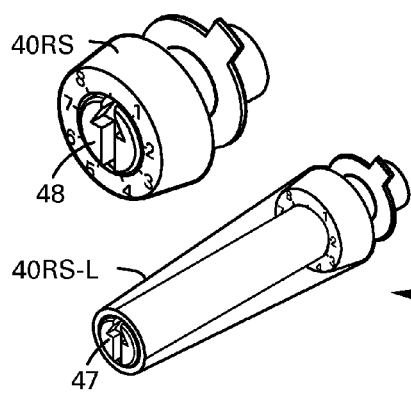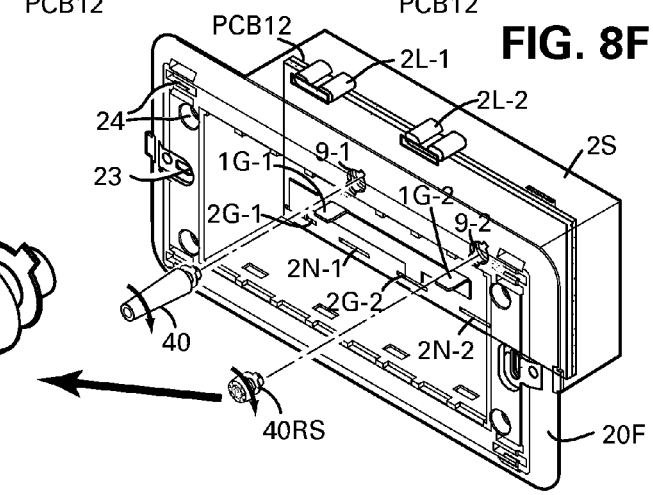

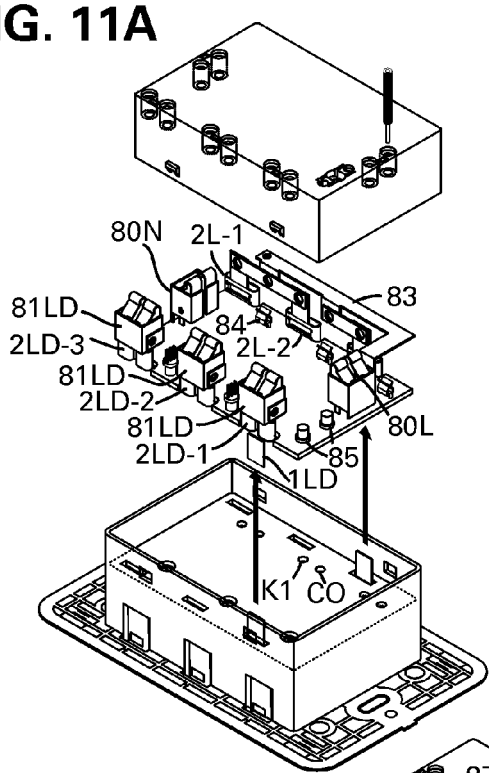
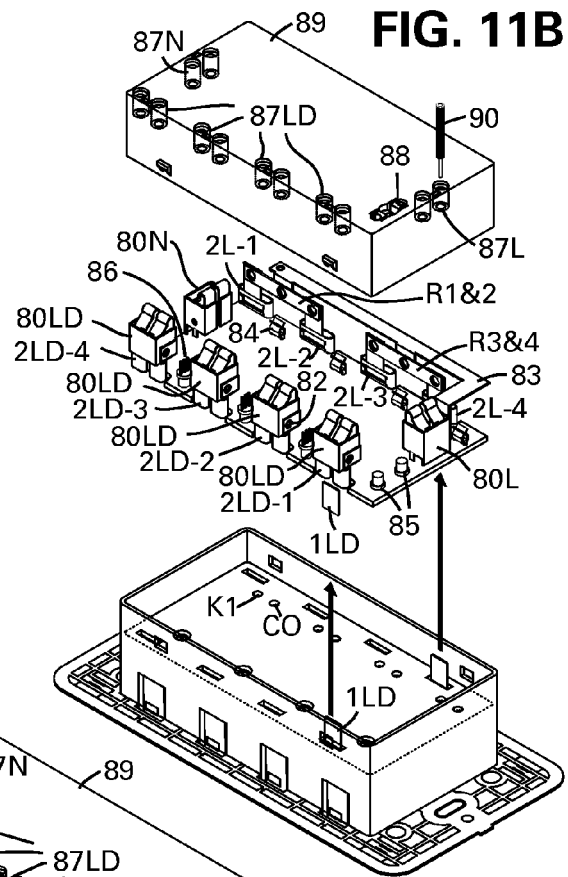
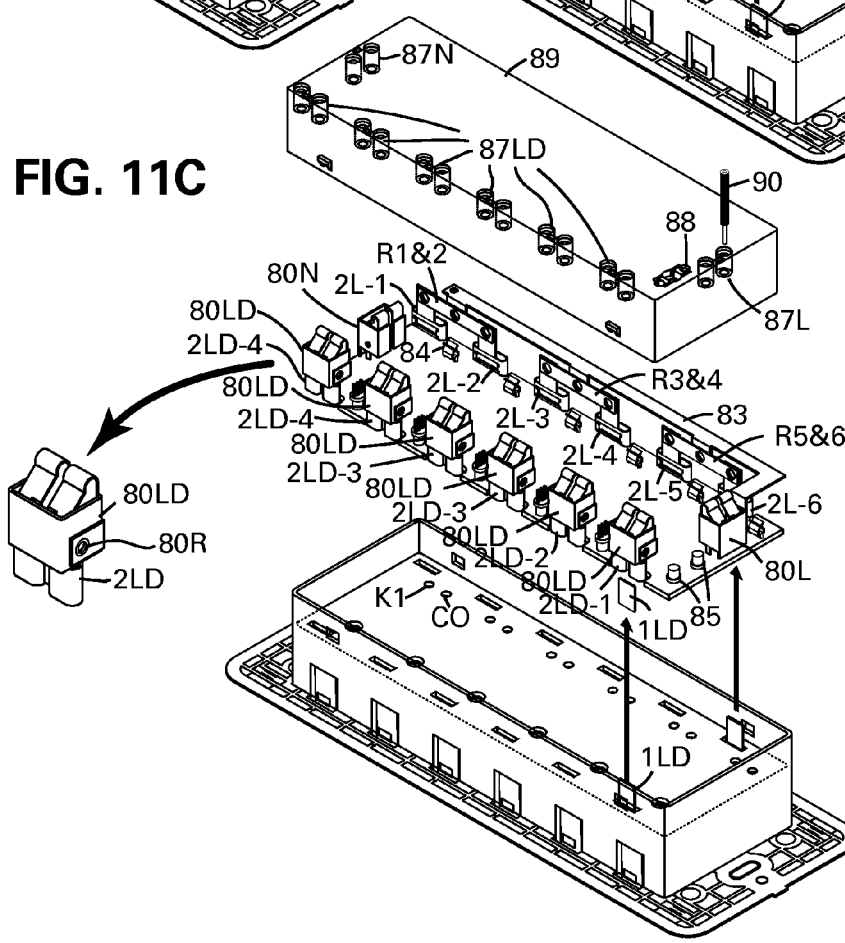
FIG. 11A
FIG. 11B
FIG. 11C

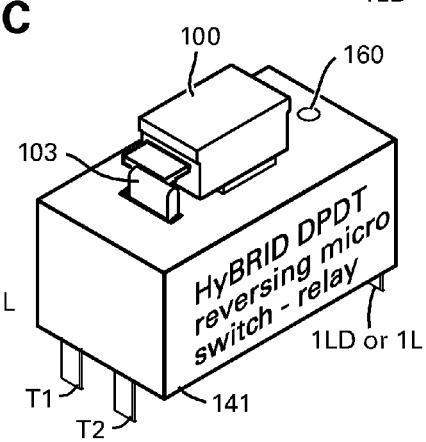

METHOD AND APPARATUS FOR SETTING AND INTEGRATING HOME AUTOMATION GRID OR NETWORK WITH ELECTRICAL GRID

BACKGROUND OF THE INVENTION

1. Field of the Invention

This invention is related to electrical automation devices including switches, relays and AC outlets for manual and remote operation of appliances including the reporting of power consumption in residences and other buildings.

2. Description of the Prior Art

Switches, relays and AC outlets for powering and/or switching on-off electrical appliances such as water boiler, air conditioners, heaters, lights and any other electrical equipment and appliances in residences, offices, public building, businesses, restaurants and factories are very well known. The well known relay devices for home automation are commonly installed in the main or a sub electrical cabinet of a given premises. The installed relays are operated via bus lines, RF, or by control signal propagated via the AC power line.

The costs of the prior known automation devices and relays including their installation are very high because the electrical wiring must be changed from its standard commonly applied wiring systems, in which the electrical power is fed via the commonly installed switches in the electrical wall boxes. This is in clear contrast to the electrical direct feed from the main or sub electrical cabinet via the relays. For controlling the relays in the electrical cabinets, the commonly used standard switches are replaced by control switches, propagating electrical signals, RF signals, AC power line signals and in some instances IR signals in open air to reach and operate the relay's control circuits in the electrical cabinets.

Such fundamental basic change in the structured electrical systems became too complex, costly and moreover the complexity is the cause for serious repeated malfunctions of the installed electrical automation systems. Further, the known home automation devices do not report the power consumed by the individual electrical appliances and do not provide usable data for reporting statistics to the home owners, nor to the yet to be born "smart grid".

The U.S. Pat. No. 7,649,727 introduced a new concept whereby single pole dual throw (SPDT) relay connected to a commonly used SPDT switch or dual poles dual throw (DPDT) switch enabling to switch the electrical appliances or lights manually via the commonly installed switch and remotely via the home automation controller. The SPDT and DPDT switches are known also as two way or four way switch respectively.

Further, the U.S. Pat. Nos. 7,639,907, 7,864,500, 7,973,647, 8,041,221, 8,148,921, 8,170,722, 8,175,463, 8,269,376, 8,331,794, 8,331,795, 8,340,527, 8,344,668, 8,384,249, 8,441,824, 8,442,792, US publication 2013/0183043 and U.S. patent application Ser. Nos. 14/045,877, 14/093,966 and 14/143,133 disclose home automation controls, connections, switches and relays for operating electrical appliance via add-on devices such as the SPDT and DPDT relays or current drain sensors and via hybrid switches including hybrid switches operated via mechanically latching relays.

The referenced US patents further disclose in details the reporting of the power consumed by the appliances through the relays or through AC outlets and plugs or through the current drain adaptors. The current drain or power consumption reports are communicated via optical signals through plastic optical fiber cables known as POF or lightguide, via IR or RF in open air, and via electrical signals through bus lines or other networks directly or via command convertors.

The above listed US patents and many pending applications in other countries disclose an add on or a combination of separate SPDT or DPDT switches and/or power sockets and/or current sensing adaptor combinations, which all teach substantially advanced residence and other building automation.

Yet, there is a need for yet further simplified automation device comprising a combination of a switch and a relay including the sensing, calculation and reporting power consumption circuits, structured within the sizes and shapes of current day commonly used AC switches at a lower cost than current day automation devices and providing further installation ease and simplicity.

SUMMARY OF INVENTION

The main object of the present invention therefore is to provide small size combination of manual switches, hybrid switches, integrated switch relay and AC outlets and sockets, each constructed to be an "attachable device" in a size preferably smaller than a commonly used mechanical AC switch or AC outlet, referred to hereafter as a "standard AC switch or outlet", that is mounted into a standard electrical wall box, such as the known 2×4" or 4×4" wall boxes in the US, or such as 60 mm round European electrical wall box or other rectangular electrical boxes as used in Europe for installing plurality of standard AC switches and AC outlet/sockets.

Another object of the present invention is to integrate a control, command and communication circuit with at least one or plurality of hybrid switches, relays and switches, including SPDT or DPDT switches and relays each with individual current sensors for calculating and reporting individual power consumption via a calculation circuit and program.

The term "hybrid switch" refers to hereafter and in the claims to one of relay/switch combination and mechanical latching relays used for electrical automation system disclosed in the referenced US patents and patent application, including the controlling of the hybrid switch and for reporting the power consumed via the hybrid switch through a video interphone system or a shopping terminal and/or via a dedicated automation controller or control station.

The video interphones are disclosed in U.S. Pat. Nos. 5,923,363, 6,603,842 and 6,940,957 the shopping terminal is disclosed in U.S. Pat. Nos. 7,461,012, 8,117,076 and 8,489,469.

Another problem affecting the electrical power consumption is the use of many relays, each consumes power for self-operating and control. Many relays installed in a residence or in a shop, or in a factory, or in public facilities persistently drain current, each consumes small or limited power. However, the overall consumed power will be substantial when many such relays and automation system circuits are installed.

Reducing the individual relay consumption and the number of control circuits is needed to reducing the overall power consumption.

Latching power relays, using dual magnetized armatures or poles or other structured magnetic elements are expensive and requiring complex circuitry and programming to control. Moreover, most of the magnetic latching relays can provide for limited current drain, because of the limited magnetic power for tightly engaging the relay contacts, such as maximum 8A which is below the commonly used AC switches for lighting as an example that are provided with 15A-16A as standard.

The well known latching relays are operated by a short power pulse and lock or latch into on or off (SPST) or change over state using SPDT or DPDT relays. After engaging the contacts the coil is no longer consuming power and the poles are magnetically latched into position. As the magnetic power is declining over time, this will eventually deteriorate the pole's contacts surface and the relay will eventually fail.

A small power relay for integration into an hybrid switch, such as disclosed in U.S. patent application Ser. Nos. 14/045,877, 14/093,966 and 14/143,133 filed on Oct. 4, 2013, Dec. 2, 2013 and Dec. 30, 2013 respectively that can be latched into position via a mechanical latching structure.

Another practical objective attained by the present invention is to provide the hybrid switch with a structure that can be fitted with different key levers and the freedom to select any from a wide variety of levers and decorative covers and frames including variety of design and colors that are available and are being regularly introduced to the construction/electrical industry by the different switches manufacturers. Hence, this invention of the intelligent support box solves the difficulties experienced to match such wide range of available AC switch designs, AC outlets design, their panel colors and decorations.

Three types of switches for AC appliances and light fixture are commonly used; a single pole-single throw (SPST) and a single pole-double throw (SPDT) switch. The SPST switch is a basic on-off switch and the SPDT is a change over switch. The SPDT switches are used for on-off switching of a given appliance such as light fixture from two separate positions, such as from the two entrances of the same hall or a room.

In instances were three or more switches are needed to switch on-off the same light fixture of a given hall or room, another type of dual pole-dual throw (DPDT) switches are used. The DPDT switch or plurality of switches are connected in a given straight-cross configuration in between the two SPDT switches described above. The DPDT switches are also known as "reversing" switches.

It is well known that two SPDT switches including the one or more reversing or cross-straight DPDT switches connected in a continuous traveler configuration provide for each individual switch to operate on its own, regardless of the other switches status. Therefore any of the switches that are connected in such SPDT and/or DPDT setup configuration will switch on and off the light fixture irrespective of the other connected switches status. This further means that there is no specific on or off position for any of the connected switches or their levers, and the switching on or off is achieved by pushing the switch lever to its opposite position, or by pushing a push on-push off key.

Accordingly the object of the present invention is to provide the intelligent box with facilities to connect hybrid switch comprising an SPDT relay to an SPDT or DPDT switch that are connected for operating a light fixture or other electrical appliance, thereby maintaining the operation via a "commonly used" manual switch and provide remote switching via the SPDT relay of the hybrid switch, or for operating the light fixture via a chain of DPDT and SPDT switches as commonly used and provide the same remote switching via the SPDT relay of the hybrid switch.

Another object of the present invention is to provide for connecting DPDT relay for remotely switching on-off light fixture or other electrical appliance that are connected to manual SPDT switches and to a more comprehensive switching setup that includes two SPDT and one or more DPDT switches.

Chain connected SPDT and DPDT switches of the electrical system of the prior art made it necessary to identify the on-off status of the appliance such as light fixture for providing accurate control command, and such data pertaining to a given circuit transmitted to the controller must include current drain, power consumption or status sensing data as disclosed in the U.S. Pat. No. 8,269,376.

For this reason the other important object of the present invention is the introduction of individual AC current sensor for each hybrid switch and AC outlet for identifying when the appliance is switched on and for processing data pertaining the power consumed by the appliance.

This is achieved by the introduction of a current sensor such as toroidal or a structured current transformer, or by a low ohmic metal alloy structure calculated to introduce a serial resistor of mili ohm units connected in line with the AC live line of each individual switch and outlet, or by a magnetic hall sensor or any other low ohmic resistor or other element that can generate output signal corresponding to the level of the current drain through the live AC terminal of the given hybrid switch, mechanical switch, relay and AC outlet integrated into the intelligent support box of the present invention for communicating power consumption data with the home automation grid or network.

The output signal level of the current sensor is measured in mV units and is amplified to a level that can be processed by a CPU, with both an amplifier and the CPU are included in the intelligent support box for generating the drained current data, or the power consumed data, or the on-off status data and combinations thereof.

The intelligent support box of the present invention includes a transceiver for receiving commands to operate the hybrid switches or the relays installed into the box and for transmitting the data pertaining the status of each connected appliance, the power consumed or the current drain. The data is processed on the basis of the identified appliance, the level of the AC current drained through the current sensor timed versus the voltage reference throughout the sinusoidal curve of the AC power as measured by the CPU.

The received commands and the transmitted data are fed via a communication network selected from a group consisting of wired network such as bus line, optical network or grid of optical cables, two way IR network, RF wireless network and combinations thereof.

The transceiver of the intelligent support box communicates at least one way of two way or bidirectional signals with the home automation controller, the video interphone or the shopping terminal. The transceiver and the CPU are programmed to respond to a power-on command to the connected appliance with a reply that a power-on is acknowledged, or respond to an inquiry pertaining status, current drain and the power consumed by the appliance, thereby updating the home automation controller, or said video interphone or the shopping terminal described in above referenced US patents, or respond with "off status" if the command was to switch off the appliance.

The reference to home automation controller hereafter is to a display device with control keys, touch icons or touch screen and circuits similar to the video interphone and/or the shopping terminal disclosed in the applications and the US patents referred to above.

The terms "hybrid switch" and "hybrid switch relay" hereafter and in the claims refers to the integrated combinations selected from a group of SPDT relay, DPDT relay, DPDT reversing relay with SPDT switch, DPDT switch and reversing DPDT switch of the preferred embodiment of the present invention.

The term "SPDT hybrid switch" refers to a stand-alone switching device for operating a given load manually and remotely.

The term "DPDT hybrid switch" refers to a stand-alone switching device with dual poles. It is used for example for operating a load in a wet or humid environment, such as bath room or laundry area for switching manually and remotely the two poles one pole feeding the live AC and the other the neutral AC.

The terms "reversing hybrid switch", "crossing hybrid switch" and "reversing DPDT hybrid switch" refer to a switching device for a given load that is switched on-off via the reversing hybrid switch and via at least one SPDT switch and/or via an intermediate n DPDT switches all connected in a cascaded chain of dual traveler lines, with each of the connected switches can operate the given load, or switch it on-off.

A major objective of the present invention is to introduce AC outlets structured to be a plug-in device similar to the disclosed self-locking structure of the hybrid switch into a counter and complementing structure of the intelligent support box comprising at least one of an optical transceiver and RFID antenna for communicating optical or RFID signal with a complementary plugs including optical transceiver, RFID antenna or an associated RFID antenna.

The optical transceiver and/or RFID antenna and/or identification setting selector are introduced into an opening or a cavity in the structured plugged-in AC outlets via a fit protruding structure of the inner cover of the intelligent support box of the present invention which is further explained in the description of the preferred embodiment.

The term "springy element" of the hybrid switch refers to a bending and/or flexing pole, or to a pole that is structured for providing spring like contact, or to a pole comprising a spring, or to a pole driven by a spring, or to an electrical contact driven by a spring, or to a contact comprising a spring, or to a contact structured into a spring like element and any combinations of a spring or structure associated with a pole and the contacts of a latching relay. A typical springy pole can be a pole of a micro switch, or similar structured multi elements pole of the different known micro switches.

The terms "pin" or "pins" hereafter and in the claims refer to a connector pin, such as commonly associated with a connector, for example 8 pin plug and socket. The pin or pins referred to hereafter cover low or high current pin having flat, round or any other shape or structure for joining a support box to wiring devices such as an outlet and a switch.

The term "joint" and "joints" hereafter and in the claims refer to a pin and to a socket or a receptacle that are jointly connecting the complementing or reciprocating pin and receptacle or socket for interconnecting AC wiring devices with a support box.

BRIEF DESCRIPTION OF THE DRAWINGS

The foregoing and other objects and features of the present invention will become apparent from the following description of the preferred embodiments of the invention with reference to the accompanying drawings, in which:

FIGS. 3A~3E are perspective illustrations showing the rear or back views of the boxes, the power outlets and the hybrid switch or the switch-relay combinations of FIGS. 1A~1D including the wiring terminals;

FIGS. 5A~5C are perspective illustrations for showing the versatility of the intelligent boxes of the preferred embodiment that can be mounted vertically for supporting modified power outlets shown in FIGS. 1B, 1D, 2A, 2C, 2E and 3C structured for mounting into vertical column boxes;

FIGS. 6A~6E are perspective illustrations showing the non-limiting versatility of the intelligent boxes of the present invention for supporting a whole range of AC outlets as used in the different countries or regions of the world;

FIG. 8A is a front view drawing of the intelligent box showing the power and ground connecting terminals including attachment sockets for the intelligent sensors or setting selector for identifying the type of appliance connected to the power outlet of the preferred embodiment;

FIGS. 8B and 8C are top and cut views of the socket and of the selectable/replaceable intelligent sensor attachment particulars;

FIG. 8D is a top view of the contact positioning for the different intelligent sensors or rotary selectors for identifying the connected load or appliance needed for reporting the power consumption via the power outlet of the preferred embodiment;

FIGS. 8E and 8F are perspective views of the intelligent box and the assembling of the selectable/replaceable intelligent sensor including the rotary selectors of the preferred embodiments of the present invention for identifying the load or the appliance;

FIGS. 11A~11C are perspective views of the structure of the self-locking terminals and the receptacles of the three, four and six gang boxes, including the low ohmic metal alloy structure for measuring the current drain of each outlet and hybrid switch of the present invention;

DETAILED DESCRIPTION OF THE PREFERRED EMBODIMENT

Figure 1A:
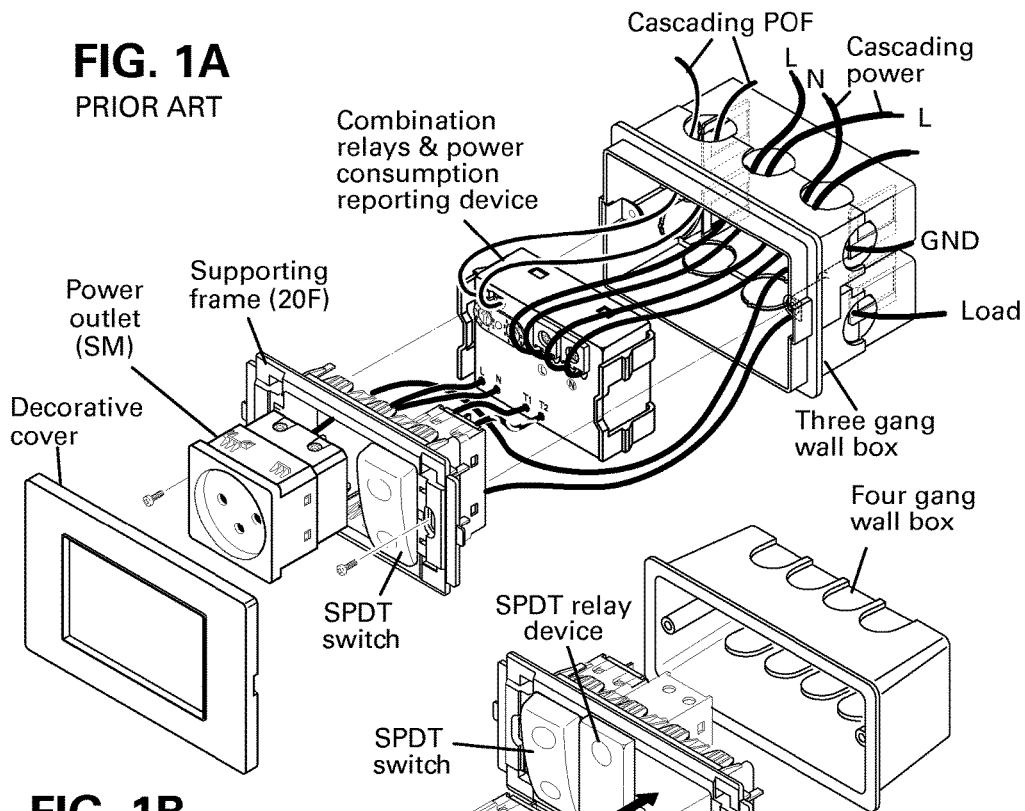
FIGS. 1A~1C are perspective illustrations of the prior art showing the installation and connections of the wiring devices of the prior art disclosed by the referenced US patents and the actual use of such wiring devices as experienced in the field.
Figure 1B:
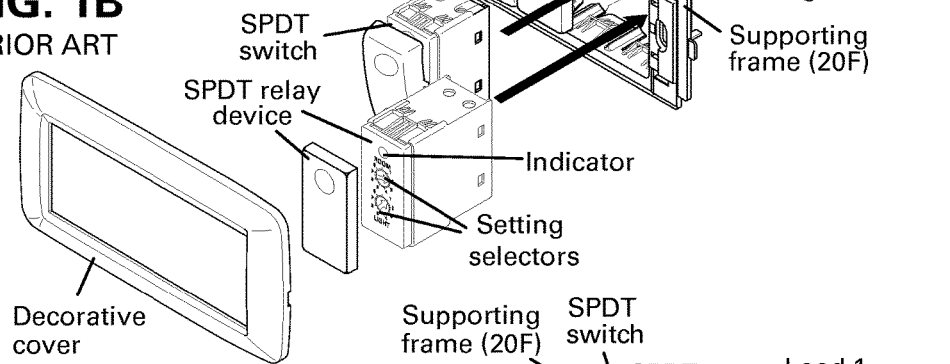
Figure 1C:
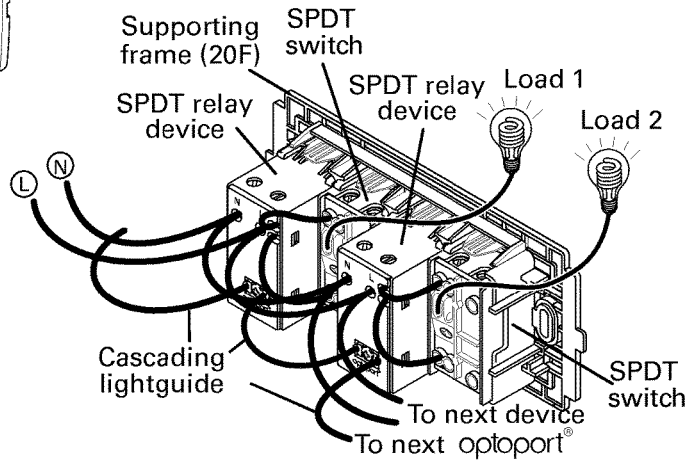

FIGS. 1A~1C show wiring connections and the assembly or installation of switches and power outlets of the prior art disclosed by the recited U.S. Pat. Nos. 7,639,907, 7,649,727, 7,864,500, 7,973,647, 8,041,221, 8,148,921, 8,170,722, 8,175,463, 8,269,376, 8,331,794, 8,331,795, 8,340,527, 8,344,668, 8,384,249, 8,442,792, 8,594,965, 8,638,087 and 8,639,465 and corresponding patents in other countries and regions.

Each recited power outlet comprising intelligent circuit for measuring, calculating and reporting the power consumed through it by a load or appliance. The recited SPDT or DPDT switches connected to SPDT relay each comprising a relay control and communication circuit for operating a load via the relay and for reporting the current drain or the power consumed by the load or appliance.

The communication circuits for control and reporting the power consumption is selected from a group comprising optical via fiber optic cable or lightguide, RF, IR in line of sight and electrical signal via bus line.

The control, command and communication of the prior art are shown in FIGS. 1A and 1C to be optical signals propagated via cascading lightguide. The term lightguide is a term used for plastic optical fiber cable, known also as POF, however other optical fiber cables and RF signals can be used for the control and communication of the prior art.

Figure 2A:
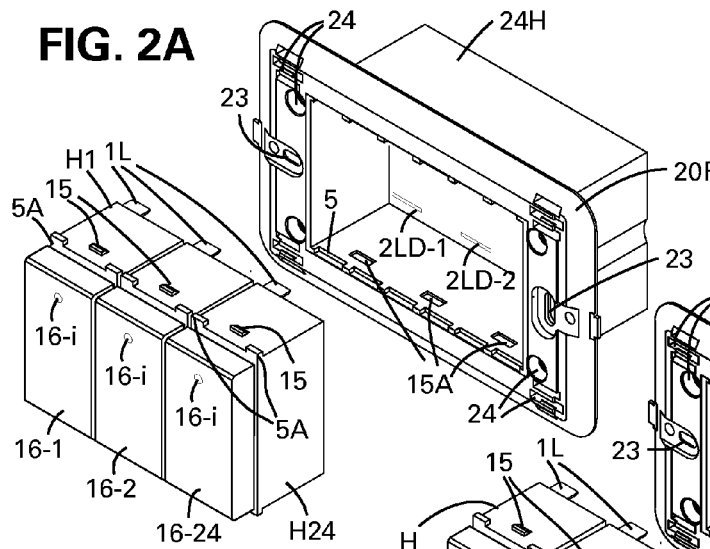
FIGS. 2A~2D are perspective illustrations of the intelligent supporting boxes for the electrical power outlets and the SPDT switch-relay combinations or the hybrid switches of the preferred embodiment of the present invention.

FIG. 2A shows an intelligent supporting box 3H for accommodating three electrical hybrid switches H1~H3, each comprising self-locking convexes 15 and stoppers 5A for locking into the indentations 15A and 5 of the boxes, when a hybrid switch H is inserted into position within the box 3H.

The box 3H and 1H+1S shown in FIG. 1B is mounted into a three gang electrical wall box, such as shown in FIG. 1A of the prior art or such as the known 4"×2" US wall box and are attached by screws, shown in FIG. 1A of the prior art to the wall box via the mounting holes 23.

Figure 2B:
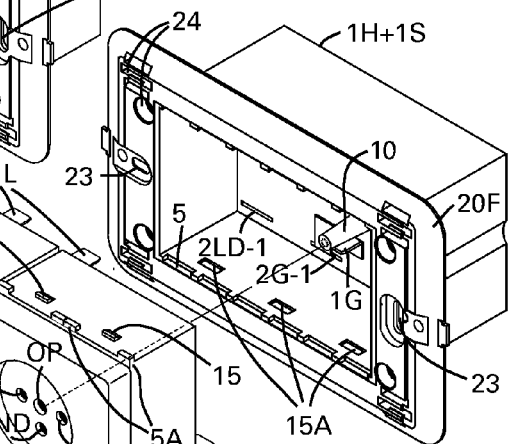
Figure 2C:
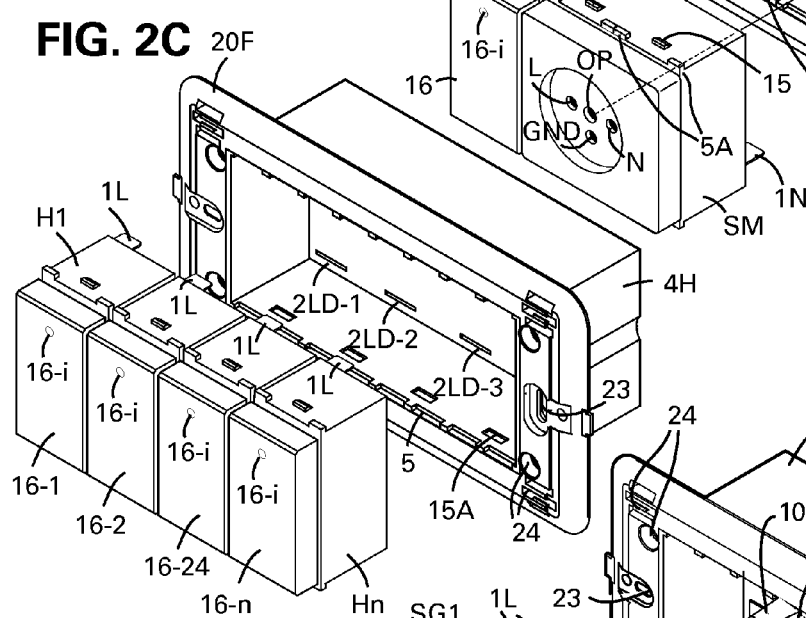
Figure 2D:
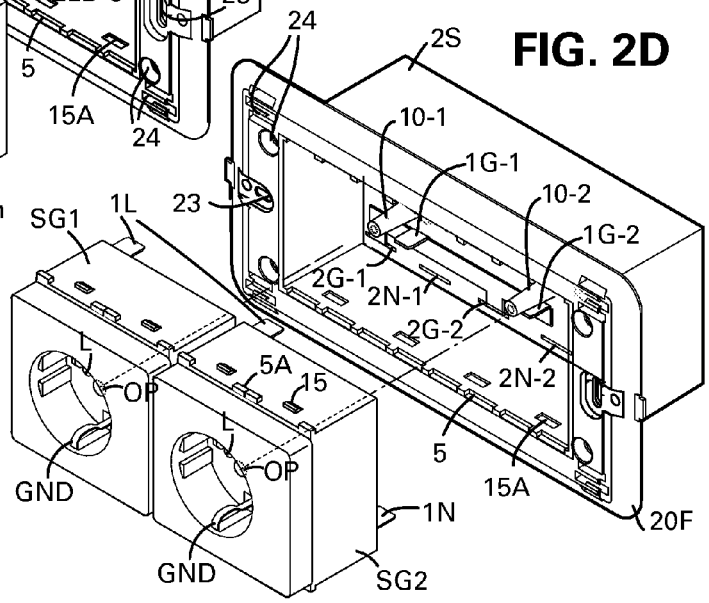

The other intelligent boxes shown in FIGS. 2C and 2D are each mounted into a four gang elongated rectangular electrical wall box, such as used in Europe, having variety of lengths and widths. All the different known wall boxes, the surrounding supporting frames 20F, the frame of the present intelligent box, the shown hybrid switches H and the shown power outlets S surrounds are covered by an installed decorative cover of the prior art shown in FIGS. 1A and 1B.

The decorative covers are adjustable to be flat with the wall surface by their self-locking studs or locks inserted through the cover locking sockets 23, shown on the four corners of the frames 20F of the intelligent boxes of FIGS. 2A~2D.

The shown frame 20F is well known and is commonly used as a supporting frame for locking into place wiring devices known as mechanical switches used for lights and the commonly used power outlets, all connected at their rears or sides to the electrical power wires via screws or self-locking electrical terminals, shown in the prior art of FIGS. 1A~1C.

Accordingly, one obvious difference between the illustrated boxes in FIGS. 2A~2D and the prior art supporting frames of FIGS. 1A~1C are the back or the rear of the intelligent boxes, including all the pins, receptacles and terminals for self-locking wiring devices. The other differences are the back surfaces and structure of the hybrid switch and power outlet that are structure and shown in FIG. 3A to be without the well known wire terminals, ready for self-locking action by a simple insertion into the intelligent box of the present invention.

The hybrid switch H is shown in FIG. 3A to include live line pin 1L, load pin 1LD, coil pin CO and key indicator access K1 for multi colors LED light. The AC or power outlet of FIG. 3A is shown to include live AC pin 1L, neutral AC line pin 1N, receptacle entry 2G for the ground or earth pin 1G and an opening 10R for an intelligent sensor or rotary selector for identifying the load or the appliance being connected or plugged into the AC outlet.

By the above it is clear that the structural differences between the prior art wiring devices supporting frames, switches and outlets and the intelligent supporting boxes with the plugged-in hybrid switches and power outlets demonstrate a clear fundamental structural difference, while the assembled wiring devices may be perceived from the "outer visible side" that the switches and outlet are similar.

Each of the mechanical switches and outlets of the prior art is individually connected to the power wires accessed through the wall box and therefore require extensive work for connecting the many wires to the plurality of outlets and switches confined to within the wall box. In contrast the intelligent box connects to few wires and the hybrid switches including the power outlets of the present invention are plugged-in through the front or the frame 20F and into the receptacles 2L, 2LD and 2N and to GND pin 1G into the receptacle 2G of the power outlet.

The substantially reduced number of power and ground wires are connected through self-locking terminals surrounding the back cover of the intelligent box shown in FIGS. 1A~5D. This arrangement reduces the number of wire connections, the time it takes to mount each individual switch and outlets, and thereby reducing significantly the errors in connecting the individual power wires.

This by itself introduces a substantial improvement to the prior art structure and facilities and this is without considering the intelligence and automation added by the present invention to the electrical wiring and system of a given residence or business building. The system as will be explained below provides a comprehensive electrical automation control including the reporting of the power consumption from each and every power switch and outlet that are detailed below.

Further, the intelligent boxes of the present invention with no automation control simplify the prior art of electrical installations. It becomes clear that the cost of the mechanical SPDT or SPST switch and the power outlet of the prior art shown in FIG. 1A can be reduced by eliminating the wire terminals and by replacing the wire terminals with plug-in pins 1L, 1N, 1LD and a receptacle 2G.

The other cost saving is the support frame that is modified or transformed into support box to include terminals 1G and receptacles 2L, 2N and 2LD as shown in FIGS. 2A~9C. All above is without the introduction of the intelligent circuits and other elements discussed later below.

The shown pins 1, receptacles 2, stoppers 5A, indentations 5, convexes 15 and the concaves 15A in FIGS. 2A~11C are in fact a group of joints for the electrical lines and mechanical structures for interlocking the wiring devices to the support box. The pin and the receptacles can be reversed such that a pin is a receptacle and a receptacle is a pin providing that they are complementary to each other. Same applies to the convexes, concaves, stopper and indentations, they can be reversed but remaining complementary to each other.

Moreover the stopper and the convex can be one structure and not two. The shown convexes, concaves, stoppers and indentations are an illustration of locking structures that can be made in many different shapes, forms and sizes.

Accordingly, the present invention will be meaningful, effective and substantially reduce the time and cost of installing the electrical wiring devices of the prior art. All this is achieved by modifying the installation of the electrical wiring devices sockets, the light switches and the support frames of the prior art and apply the plug-in installation methods recited and shown above.

Figure 4A:
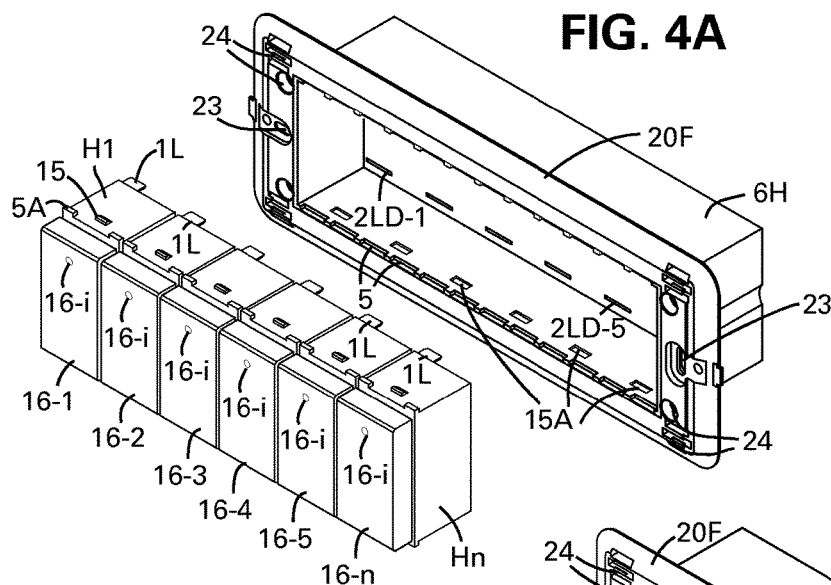
FIGS. 4A~4C are perspective illustrations showing the expanded intelligent boxes of the present invention shown in FIGS. 1A~1D for accommodating n number of electrical power outlets and hybrid switches, or switch-relay combinations of the present invention.
Figure 4B:
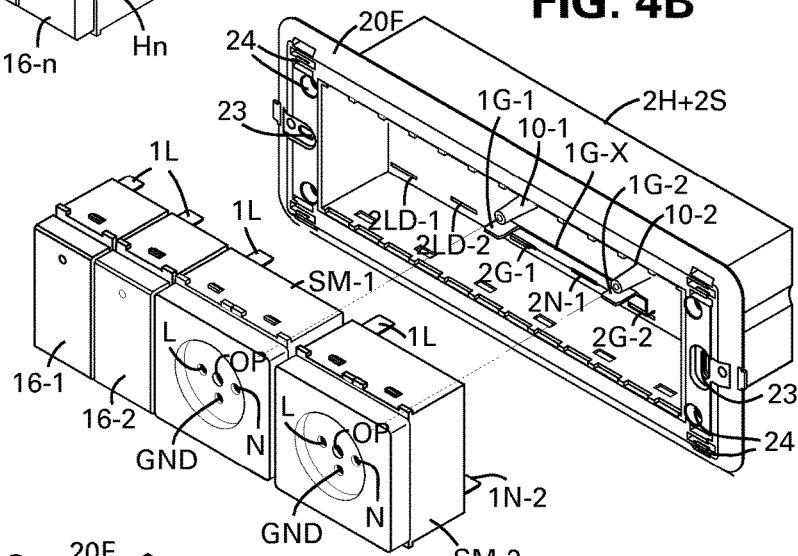
Figure 4C:
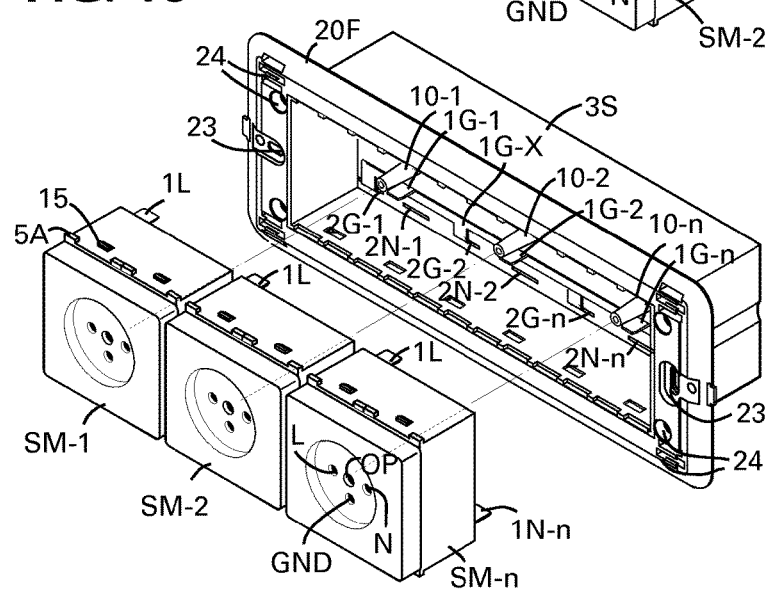

The intelligent support boxes can be expanded to accommodate n number of hybrid switches and power outlets as shown in FIGS. 4A~6E. FIGS. 4A, 4B and 4C show the intelligent boxes 6H, 2H+2S and 3S, all are configured as 6 gang box, wherein a "gang" is the width size of the hybrid switch H which is similar to the width size of the prior art mechanical switches, ranging to be between 22~24 mm, or less than 1" width. However any variation of the switch sizes can be accommodated by the intelligent support boxes of the present invention.

The power outlets, be it the SM used in Israel and the middle eastern countries plugs and socket, or the SG type used in Germany and overall in Europe, or the SF type which is a French version of the European plugs and sockets, including Japan and the US power outlets for two pin plugs SU, the US and Japan power outlets for three pin plugs SUG, the power outlets for Australian type plug SA that are also used in China and the UK and Hong Kong outlets for British standard plug SB are all accommodated in dual gang sizes.

For example the hybrid switch H width size is 23.5 mm the width of the power outlet will be about 46-47 mm. All the different power outlets are shown in FIGS. 4C, 5A, 5B and 6A to 6D. The power plug for two pin US and Japan plugs are accommodated in a single gang size.

It is important to note that the power outlets are also structured for vertical mounting, enabling the installation of power outlets into a vertical column shown in FIGS. 5A, 5B and 6A~6C, wherein the Middle East outlets SMV, the French SFV outlets, the Australian SAV outlets and the USA SUGV outlets are shown to comprise the locking convexes 15 and the stoppers 5A on the left and right surfaces of the outlet cases for attachment into vertically mounted support boxes, versus the convexes 15 and stoppers 5A that are introduced at the top and bottom surfaces of the outlet cases for attachment into horizontally mounted intelligent boxes.

From the above explanation and the assemblies shown in FIGS. 2A~6D it is obvious that the intelligent support boxes of the present invention are well adapted to provide versatile, simple and low cost installation for the many different outlets that are known as standard outlet in given countries and regions. The intelligent support box is also made to accommodate plug-in mechanical switches made to fit the size and shape of the prior art wiring devices to offer many other advantages.

FIGS. 2B and 2D show the intelligent sensors 10, 10-1 and 10-2, each may comprise an optical transceiver port, termed hereafter as optoport, or RFID antenna. Both the optoport and the RFID antenna receive a code signal for identifying the appliance connected to the power outlet, and are further used for communicating coded command signals for operating the appliance.

The uniqueness of the intelligent sensors 10 are further discussed later in connection with the block diagram of the electrical circuit, but it is obvious that the sensing tip, be it RFID antenna, a terminated end of plastic optic fiber or an optical transceiver is introduced into a sensor receptacle 10R at the rear center of the power outlet structure, shown in FIG. 3A, to reach the front surface of the outlet. The sensor 10B of FIG. 8C is the shown opening of an optoport OP in FIG. 2B or the shown flat recess with no opening for the RFID tags 20B, 20U, 20A or 20EU of FIGS. 7A and 7B.

It is important to note that the shown plugs and outlets with attached RFID antenna and tag or the optoports are structured to be introduced to a three pin plug and outlet and two pin plug and outlet, using identical RFID tag and optoport position. This is particularly important for such plugs and outlets used in the US, EU and Mid-eastern countries having two pin plugs with 19 mm pitch that can be reversely plugged and this mandate the introduction of both the RFID antenna or the optoport at the center of the two pin plug to be always in direct optical link and in close proximity for the RFID communications.

Figure 7A:
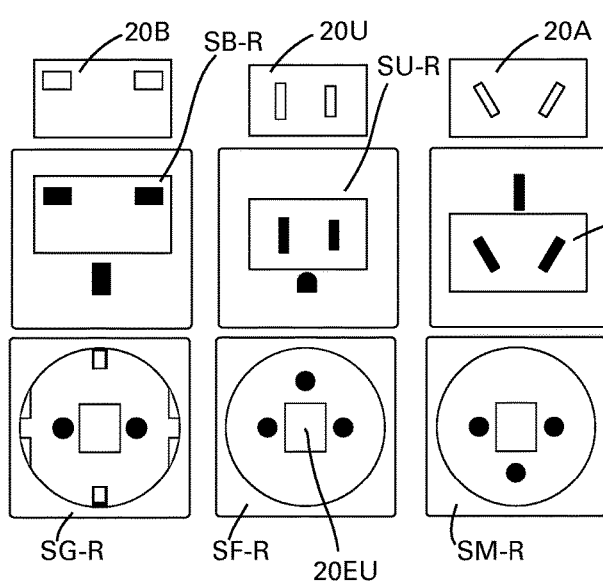
FIGS. 7A and 7B are perspective views and illustrations showing the introduction of RFID tags onto different power plugs for identifying the load or the appliance connected to a corresponding power outlet supported by the intelligent boxes of the preferred embodiment.
Figure 7B:
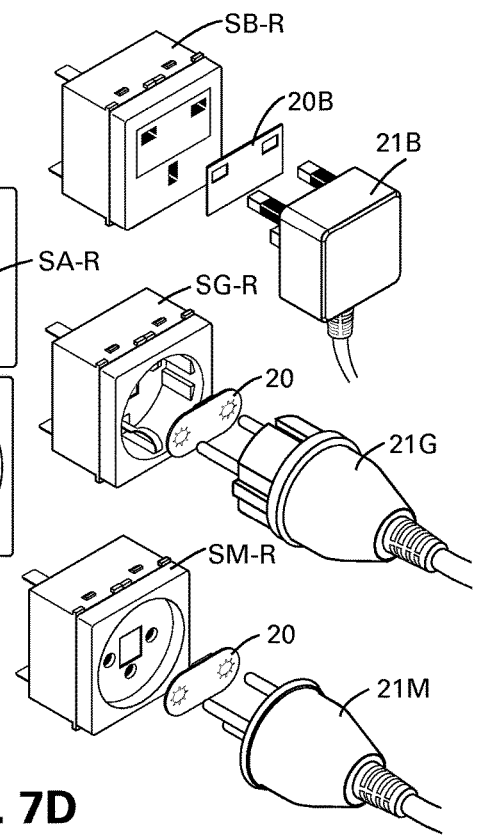
Figure 7C:
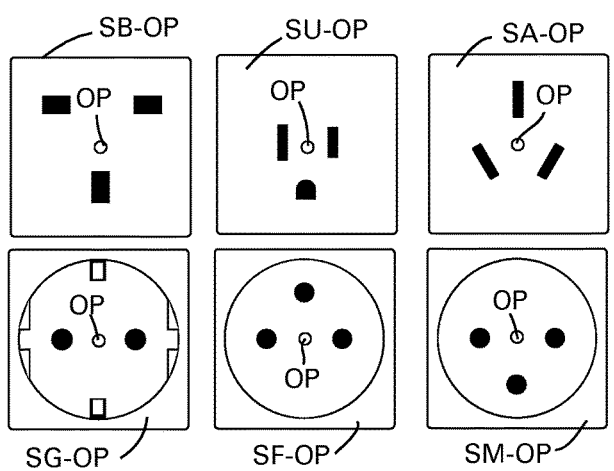
FIGS. 7C and 7D are perspective views and illustrations showing the introduction of optoports or optical transceivers for controlling the appliances and reporting the power consumed via the power plugs and the power outlets supported by the intelligent box of the preferred embodiment of the present invention.
Figure 7D:
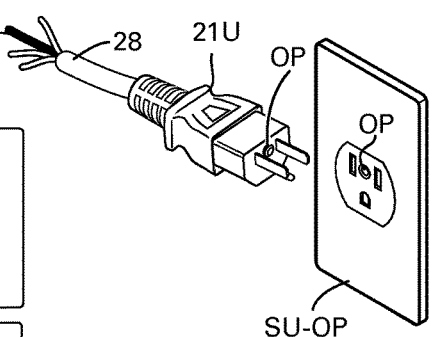

The optoport OP are shown in FIGS. 7C and 7D in the center of each shown outlet front surface as SB-OP, SUG-OP, SA-OP, SG-OP, SF-OP and SM-OP in FIG. 7C, and the illustrated US plug and socket in FIG. 7D.

It is very important to ensure that the RFID tag and the RFID antenna are communicated from a precise position and a very close proximity to avoid reading the RFID tag by an adjacent RFID antenna, such as for example, the adjacent outlets SU of FIG. 6A, shown as optoports, but can be structured to employ RFID sensors.

It is clear however that the RFID tag 20U of FIG. 7A can be introduced onto the two pin US plug and into the outlets SU of FIG. 6A. Such introduction however has to ensure that no adjacent reading of the RFID tag is possible. This mandate small size antenna and RFID coil and the use of a lower frequency RFID such as 125 KHz, which is explained further below.

FIG. 8A shows the inner surface of the rear cover of the intelligent support box 2S. The upper receptacle are shown as 2L-1 and 2L-2 for connecting two pins 1L shown for example in FIG. 2D of the outlets SG. This is in contrast to the example of FIG. 2C showing four L1 pins as used for connecting four hybrid switches H, shown as Hn. It is obvious that a change in the structure is the removal of two upper receptacles 2L from the intelligent box 2S of FIG. 8A.

Further, the four bottom receptacles shown in FIG. 8A are divided into two different receptacles, two neutral power line receptacles 2N-1 and 2N-2 and two ground line receptacles 2G-1 and 2G-2 linked via ground bar 1G-X to dual ground line pins 1G-1 and 1G-2. The four bottom receptacles 2L-1, 2L-2, 2N-1 and 2N-2 correspond precisely with the pins 1L and 1N of any type of outlets shown above, be it SM, SMV, SG, SGV, SF, SFV, SUG, SUGV, SA, SAV, SB or SBV and any of these outlets can be introduced into the intelligent box S2 of FIG. 8A.

The ground pins 1G-1 and 1G-2 will similarly fit each receptacle 2G shown in FIG. 3A and the introduction by insertion of an outlet will connect firmly the three pins of the outlet, i.e., the live line L, the neutral line N and the ground line G. The insertion of the outlet body into the intelligent box will lock the body to the box via the locking convexes 15 into the indentations 15A and firmly hold the outlet in place via the stoppers 5A against the indentations 5 shown in FIG. 2A.

The shown intelligent sensors 10, 10-1 and 10-2 of FIGS. 2B and 2D are pre-defined sensors such as for reading and communicating RFID or optocode signals referred to above. As such they are preassembled and provided as an intelligent box with a given type sensor for introducing into outlets with OP opening shown in FIG. 7C or into outlets for accommodating the RFID tags shown in FIG. 7A.

The intelligent support box 2S of FIG. 8A is provided with replaceable/selectable sensors be it RFID or optoport and moreover, the sensor 10 can be replaced with a setting selector 40RS or 40RS-L for manually setting the appliance type identification for providing control and for reporting the power consumption by the identified appliance connected to the given power outlet.

The shown openings 9-1 and 9-2 are a bayonet shaped opening for locking the inserted intelligent RFID sensor 41, optoport 42 or the rotary setting selector 40RS or 40RS-L shown in FIGS. 8B~8D.

Shown in FIG. 8B is the bayonet structure comprising PCB 60 having three rows of contacts 51, 52 and 53. The contacts 55 are shown in FIG. 8C as touching the surface of the main PCB 12 of the intelligent box incorporating a CPU that is discussed and explained later below. The main PCB 12 shown also to include three rows of contact 41, 42 and 43, complimentary to the rows of contacts 51, 52 and 53 with only one row of the three bayonet rows include the contacts 55 of FIG. 8C, such that when the bayonet is rotated all the way, in the arrow 63 direction to the stop position 62, the contacts 55 will be aligned with and touch the corresponding PCB contacts 41, 42 or 43.

As the intelligent sensor 40 is provided as a preassembled sensor, such as comprising the RFID sensing antenna 41, optical transceiver/sensor 42, or a rotating setting selector 43, each row of the provided contacts 55 is assembled into a corresponding row, such that the RFID sensor 41 of FIG. 8D will engage the contact 51 of the bayonet PCB 60 and the sensor 10B inside the center cavity 10A shown in FIG. 8C will be the RFID antenna connected via the line 10C to the contacts 51.

Similar set-up is provided for the optoport sensor 42, the contacts 55 are introduced into the row 52 for engaging the contact rows 42 of the main PCB 12, which provides for electrical signal communication from an optoport transceiver 10B replacing the RFID antenna referred to above.

By this it becomes clear that it is possible to introduce into a mounted intelligent support box a selected/replaceable intelligent sensor with bayonet rotating base or other attachment (not shown) or attaching means, such as using self-locking convexes or a plug and socket or a pin and sensor receptacle for simple plug in attachment.

The rotating setting selector 40RS or 40RS-L shown in FIG. 8E are manual setting selector for setting an identification to the appliance connected to the power outlet, for reporting the power consumed and the type of the appliance that consumes the reported power.

The shown RS contacts 53 of the bayonet PCB 60 are positioned to engage the contacts 43 of the main PCB 12 when the bayonet bar 61 is rotated all the way to the lock position 62, connecting the rotary selector output to the CPU for identifying the appliance to be connected to the power outlet S. The selector 40RS or 40RS-L can be set by the rotating knob 48 prior to installing the outlet S into the intelligent box 2S of FIG. 7A, or the rotating knob 47 can be used to be set into a given type appliance through the opening in the front surface of the power outlet, such as shown in the OP opening in FIG. 2B or 4C.

This is provided by the longer rotary setting selector 40RS-L of FIG. 8E. This enables manual setting option for the user self-setting through the front surface of the power outlet. FIG. 8F shows the installing of the bayonet sensor 40 and the rotary setting selector 40RS or 40RS-L into the bayonet socket 9-1 and 9-2 through the inner rear cover of the intelligent support box 2S of FIG. 8F.

The setting of particulars pertaining the load or the appliance are recited in the many referenced US patents referred to above, including the use of setting selector, such as the rotary selectors 40RS. The recited particular settings of the prior art devices and the particular settings to for the intelligent support box of the present invention further provide the particulars loading of each power outlet, hybrid switch or relay installed into the box and the particulars of each connected appliance. The particulars are loaded into the memory 50M of the CPU 50 of the block diagram of the electrical circuits shown in FIG. 12.

Loading addresses, locations and particulars of the loads are also disclosed in the referenced US patents and include loading via RFID or optical loaders such as IR remote control unit programmed to introduce particulars, addresses and the type of the connected appliance(s).

Figure 9A:
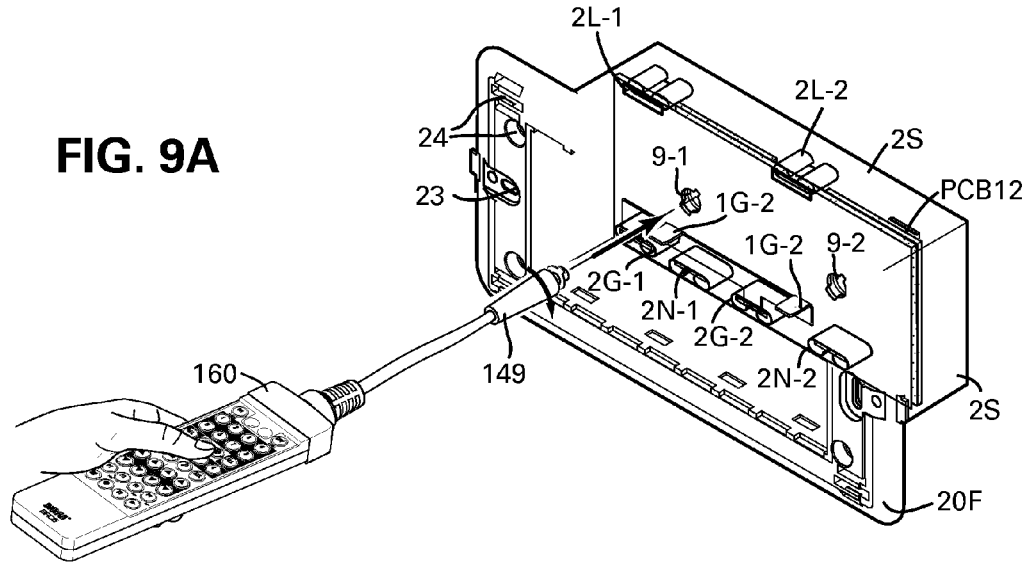
FIG. 9A is a perspective illustration showing the loading of data into the intelligent supporting box via the socket of the intelligent sensor of the preferred embodiment.

Other well known loading of particulars can be processed via PCs, iPad and similar devices. The loading under power however, by a loading device, such as the remote control unit 160 must offer adequate insulation for connecting a loading bayonet adaptor 149 direct into accesses 9 while the box is connected to the live AC line as shown in FIG. 9A.

Figure 9B:
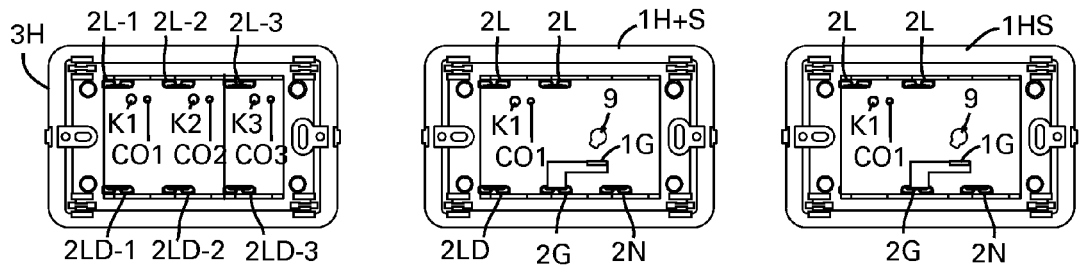
FIGS. 9B and 9C are top views of the internal receptacles as provided for the different three and four gang boxes models.
Figure 9C:
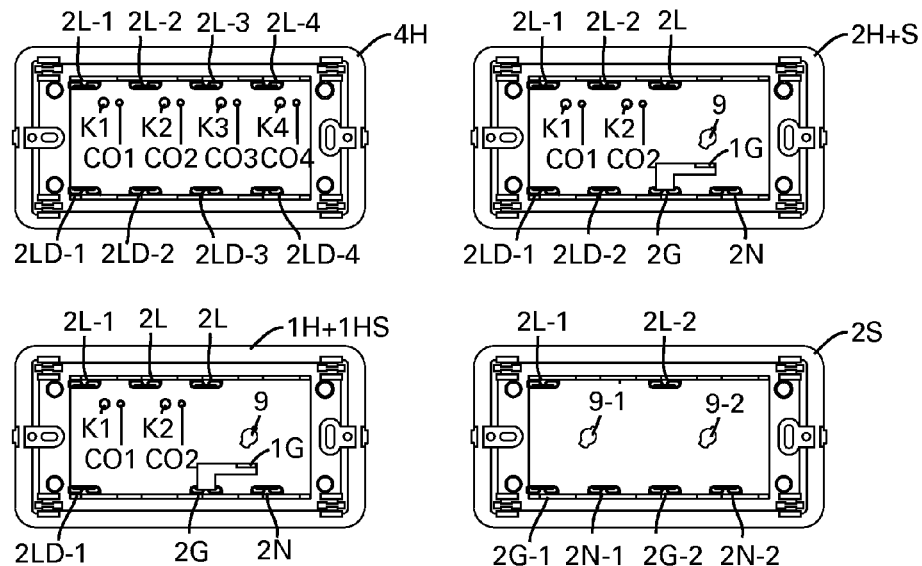

The particulars to be loaded may include the type of the intelligent box which identifies the particulars of the terminals. The box may include automatic pre-loading of such particular as set during the box production. Regardless, FIGS. 9B and 9C illustrate the many variations that can be configured for the receptacles of the different intelligent box models.

The shown differences do not reveal the whole set-up of particulars. The shown receptacles are configured and presume outlets and hybrid switches will be installed to the full extent of the boxes as designed. In practice however it is expected that larger boxes will be installed for future expansion, but in practice the number of AC outlets and/or hybrid switches, mechanical switches and/or relays will not be introduced to the box capacity.

For such short installation of hybrid switches and/or AC outlets there is a need to update the CPU memory of the intelligent box with the actual installation on site. For such purposes, the used of the loader 160 with the bayonet connector 149 is very helpful. Similar is the use of RFID or optocode loader disclosed in the U.S. Pat. Nos. 8,442,792, 8,594,965 and 8,639,465.

The identifying of loads or the different appliances in a residence, office, business or other building structures can be divided into three categories or groups. The first are the fixedly wired appliances or loads, such as lights, water boiler, ceiling fans, curtains and blinds and some types of HAVC or air conditioners that are permanently wired.

The second group of loads or appliances are the "perpetuity plugged" appliances that are plugged into a given power outlet 24 hours/7 days a week, or all years round, such as refrigerators, coffee maker, ovens, micro wave ovens, washing machines, air conditioners, television and A/V equipment.

The third group is the random plugged loads or appliances such as food processors, Juicer or cookers, steam irons or other hand tools, personal care appliances such as air dryers or shavers, chargers and/or PCs.

It is clear that some of the appliances in the third category or group may be plugged into a given power outlet "permanently" or for long periods of time, for example a PC printer, or a "humidifier".

The setting or sensing by the intelligent support boxes of the present invention provide a range of solutions that were not available in the prior art, such as the ability to introduce "fixed" solution for the long term or permanently "plugged" appliances of the second group, such as refrigerator or washing machine by loading their particulars via the hand loader 160 via the loading connector 149 or FIG. 9A.

The other solution for loading can be the loading via optical loader disclosed in the recited US patents of the prior art or via RFID loader, or direct loading by the electrical installer during the installation of the boxes, or by setting such particulars via the setting selectors provided in the rear cover of the intelligent boxes shown in FIGS. 3B~3n.

The identifying of the randomly plugged appliances are best served by the used of optically introduced identifier of the power plugs. Optically communicated signals are immune to noises; they are reliable and can be provided at low cost. The other practical, low cost identifiers are the RFID tags recited above and shown in FIGS. 7A~7D. The third is the use of the rotary selector RS40-L that is accessed through the front of the AC outlet that can be easily reached by the dweller.

Figure 10A:
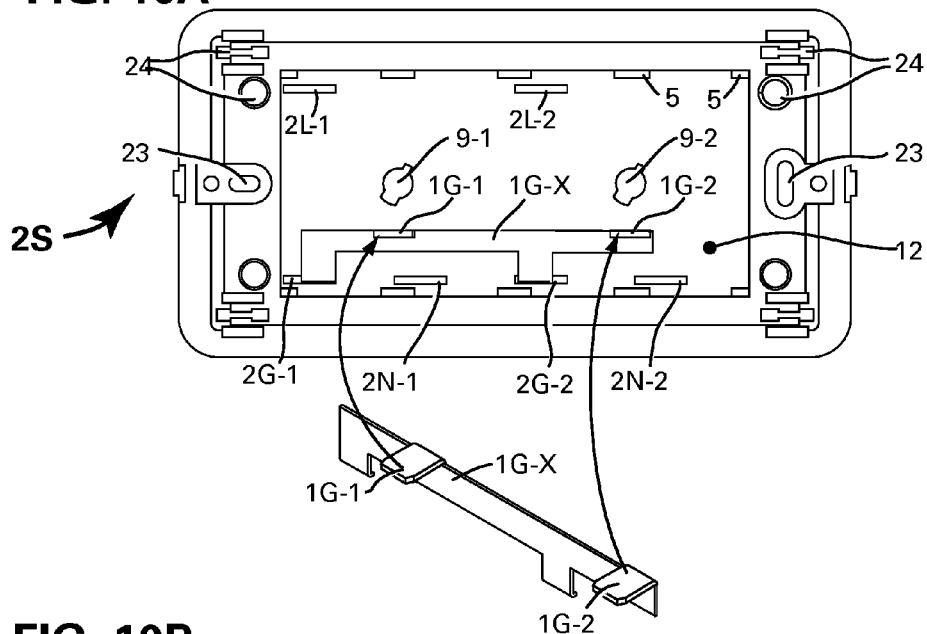
FIG. 10A is a top view illustration including the ground connecting bar for the power outlets of the preferred embodiment.
Figure 10B:
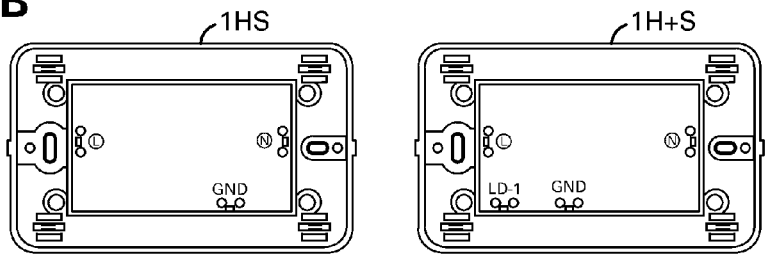
FIGS. 10B and 10C are rear views of the self-locking terminals of the different three and four gang model boxes of the present invention.
Figure 10C:
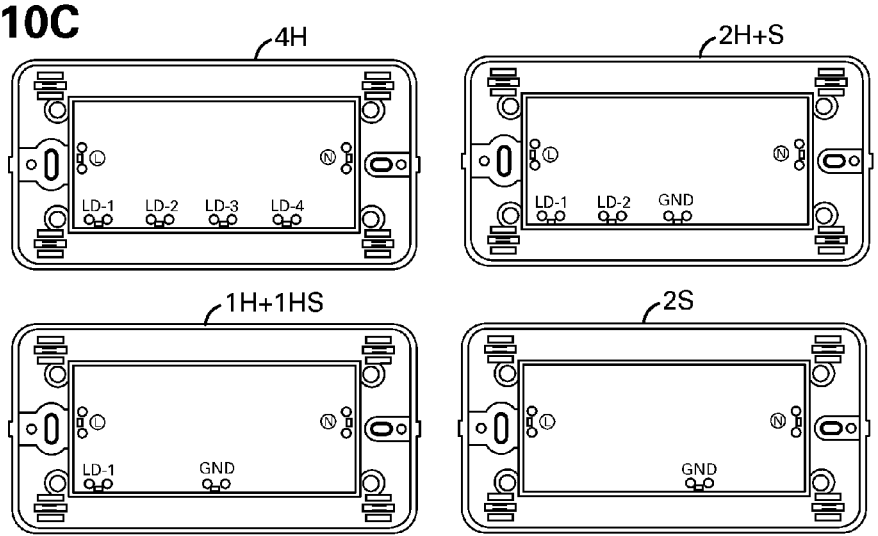

FIGS. 10B and 10C show the variation of the snap-in or the self-locking wire terminals provided for the different intelligent support boxes of the present invention.

Each terminal provides for in-out or cascading connections to another box, be it adjacent or a distant box, yet the cascaded boxes are commonly installed in the same zone or room. This is due to the electrical wiring codes and rules that are mandating individual power lines for given load in each individual room or zone.

What is obvious with the 4H box of FIG. 10C is that only a single neutral N and a single live L wires are needed to power four loads, such as four lights. Each hybrid switch or a mechanical on-off switch such as shown in FIG. 14D or an SPST relay (not shown) is connected to a single load LD terminal and each load power consumption is reported individually. It is also possible to power two load or more loads via a single hybrid switch and its two snap-in terminals, each shown as LD1~LD4. Ground terminal is a must for power outlets.

FIGS. 10A~10C also clearly illustrate that when an AC outlet is used the load terminal is not needed and is not used. Yet a ground terminal is absolutely required for AC outlet, for this purpose and other wiring devices considerations at least one wire terminal can be an assignable terminal. In the example of AC outlet, the terminal that occupied the load position becomes assignable terminal for ground connection. Yet it may be assigned to other wire connection such as separate live AC or neutral AC when the circumstances such as local codes mandate so.

The many other configurations illustrate the simplicity of the box structure that can be manufactured by eliminating or adding receptacles, pins, self-lock or snap-in terminals and structured current sensors made of low ohmic metal allow shown in FIGS. 11A~11D.

Shown in FIG. 11D is the combination of the receptacle 2LD riveted to the self-lock or snap-in wire terminal 80LD, using rivets 80R. Similar riveting are applied to the structured current sensors R1~R6 that are riveted to a solid brass or copper bar 83 for providing live power to the receptacles 2L-1~2L-6.

Not shown is the neutral brass or copper bar that feeds the power outlets with the neutral line via the receptacles 2N-1~2N-n shown in FIGS. 6D and 6E. The neutral receptacles 2N are attached to the neutral bar (not shown) via rivets 80R, the same way as the live line bar 83, but without the structured low ohmic current sensors.

From the above explanation it should be clear that the many models do not require major change in molds and simple mold adjustments, known as inserts can well provide for mass production of the casing, covers, terminals, receptacles and pins needed for the mechanical construction of intelligent support box of the present invention, all at low cost.

Moreover, it is clear that the interconnecting links between the power outlets, the hybrid switches, the SPDT relays and switches are solid copper or brass bars shown in FIGS. 11A~11C, including the ground bar shown in FIG. 10A, all riveted to or supported by heavy current receptacles provide superior interconnections to the installed bunch of wires inside wall box to the different switches and outlets of the prior art.

Figure 12:
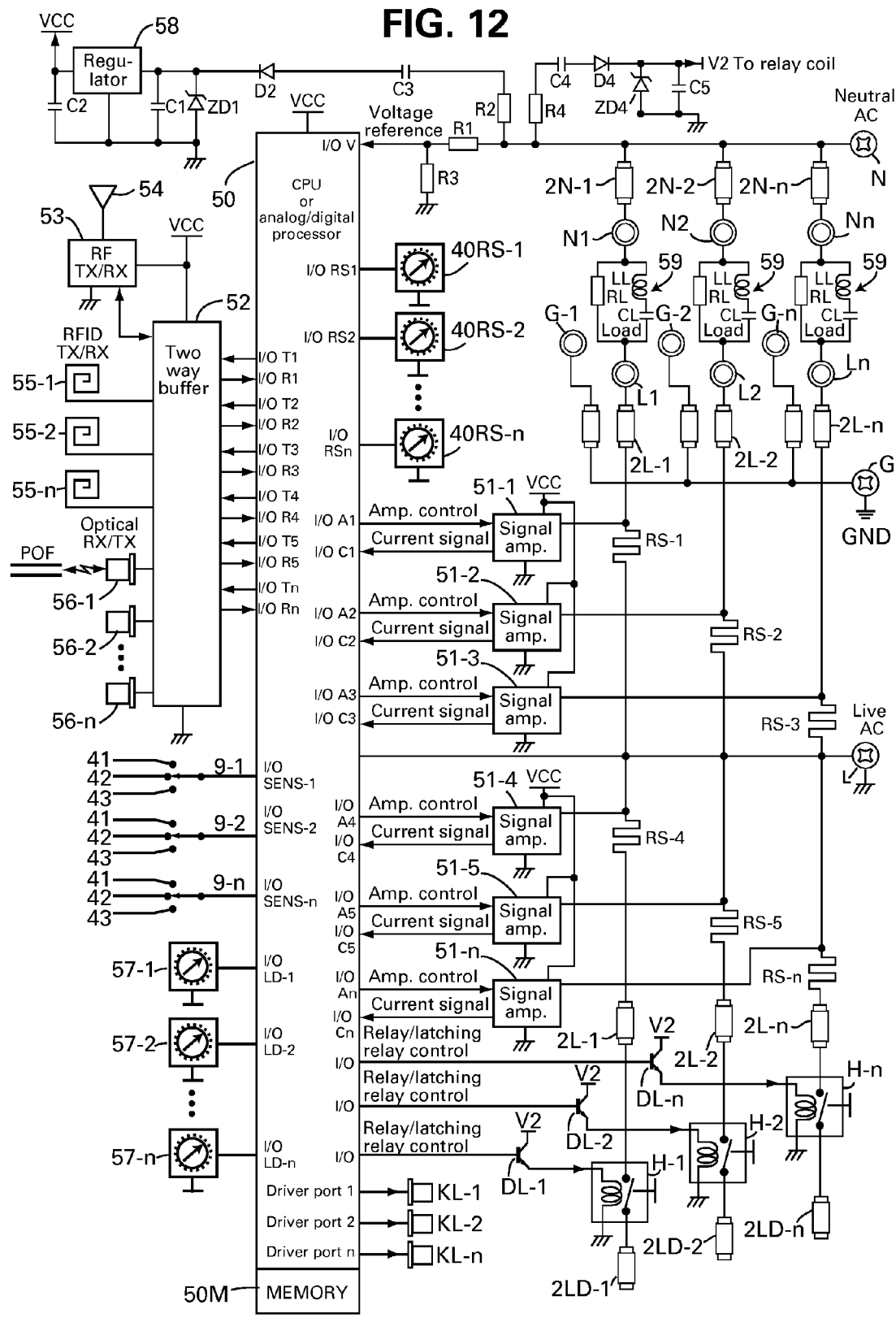
FIG. 12 is an electric block diagram covering the electrical interconnections of the pins, receptacles and terminals of the intelligent box, including the RFID, RF and optical communication circuits, the CPU, the memory and current sensing circuits for the reporting power consumption of the preferred embodiment of the present invention.

FIG. 12 is a block diagram of the electrical circuit, the CPU 50, the memory 50A and the communication circuit including the optical transceivers 56, the read and read write transceiver RFID antennas 55, the RF transceiver 53 including the RF antenna 54 which can be a pattern or a drawn line of the PCB 12 shown in FIG. 8C.

The current sensing circuits include the amplifiers 51 and low ohmic resistors $RS_1$ to $RS_n$, each feeds micro or mili volt level signals, developed over each resistor RS structure by the current drained through it by a load 59.

The shown optical transceivers 56 communicate optical signals to a lightguide known as plastic optical fiber or POF, which is disclosed in the referenced US patents, publications and applications. The optical signal is accessed via an optical access or an optical port of an AC outlet for propagating data pertaining current drain, power consumption and the load or the appliance particulars.

The other way signals of the two way communications include inquiries by the system controller and commands for operating a selected appliance. The optical transceivers can be operating in the IR wave length such as 940 nm and propagate and receive IR signals in line of sight from and to and a handheld IR remote control such as disclosed in the referenced US patents.

The block diagram of FIG. 12 is showing the power consumption reporting circuit and the communication circuits of the preferred embodiment of the present invention including the CPU or analog/digital processor 50 and the current signal amplifiers 51 for sensing, measuring and processing the current drain signal including the calculation of power consumed by a load 59. The load is shown as an ohmic RL, an inductance LL and/or capacitance CL loads and combinations thereof. The communication circuits include the two way buffer 52.

Electrical wiring devices, be it in buildings, including factories, warehouses, schools, public places, shops, residences, businesses and others, are subject to a strict electrical and building codes and rules, prohibiting the connections and/or the mingling of low voltages signals and/or power with the electrical wiring devices and/or the electrical wiring. This limits the communication circuits to communicate one of RF or optical or both.

The optical signal be it IR in line of sight, visual light or IR via optical cables including plastic optical fiber, known as POF can be implemented by the circuits of the intelligent support box of the present invention.

The circuits of FIG. 12 are powered by a low volt and low current power source provided by feeding AC power through high voltage AC grade capacitors shown as C3 and C4 in FIG. 12, or to power supply circuit disclosed in U.S. Pat. No. 8,441,824.

The VCC power source in FIG. 12 is fed via the protection resistor R2, the capacitor C3 and the diode D2 to the input or terminal of the DC regulator 58.

The regulator 58 shown is a well known analog voltage regulator IC available by many IC manufacturers at very low cost. The shown regulator input circuit includes the filter capacitor C1 for providing low rippled DC input to the regulator and a zener diode ZD1 for protecting the regulator from voltage surges, commonly affecting the electrical systems. The output of the regulator includes a storage capacitor C2 for maintaining sufficient charge to power the intelligent support box circuits.

For powering the relay coil CO it is advantageous to use higher voltages such as 18V or 24V with limited current such as 20~30 mA. For powering the latching relay coil CO it is preferred to use a short V2 pulse of for example 32V and current of about 80 mA for less than 30 mili second. For such supply of non-regulated DC power V2, the circuit shown in FIG. 12 includes the protecting resistor R4, the large 275V AC rated capacitor C4, a rectifier diode D4, a storage capacitor C5 and a protection zener diode ZD5 for outputting V2 to the relay coil directly or to the latching relay coil via the driver DL of the control circuit shown in FIG. 12.

The live AC line is shown connected to the ground which is also the negative line of the VCC and the V2 coil power line. The VCC shown is, for example, a positive 3.3V, but can be 5V or 1.8V or any voltage commonly applied to a CPU and other ICs, including the communication ICs shown in FIG. 12.

As the live AC is connected to the negative pole of the DC supply, the power feed into the input terminal of the voltage regulator 58 is connected to and fed from the neutral AC line to the rectifying diode D2 via the series capacitor C3 and C4, AC grade capacitors and depending on the power line voltages, may range from, 0.1~0.47 micro farad for the 230/240 VAC (EU, UK) and up to 0.22~0.82 micro farad for 100/120VA (Japan/US) also considering the power frequency 50 Hz or 60 Hz respectively.

The capacitors C3 and C4 rated at 275 VAC are well known and are approved by all known standard approving entities such as UL, VDE, JIS and BS for use in electrical power circuits. The resistors R2 and R4 between the capacitor C3 and the neutral AC line are protection resistor to prevent surges and/or may be a self-destructive resistor to prevent fire in the remote event that a short circuit or heavy leakage will occur.

The signal amplifier 51 is the well known linear amplifier or dual amplifiers IC, connected in series for amplifying the current drain signal. The amplifier 51, combining two amplifiers also known as operational amp. or op. amp., with each amp is set to amplify by, for example, up to a factor of 100 and the two in the series can therefore provide up to 10,000 amplification factor.

The CPU (Central Processing Unit) or analog/digital processor 50 hereafter referred to as CPU includes analog to digital and digital to analog converter ports, digital ports and analog ports. The CPU 50 is a commonly available low cost CPU, such as 8 bit or 16 bit with low power consuming processor including a memory 50A. The CPU operates on 1.8V or 3.3V, with an operating current such as less than 3 mA and a sleeping current of few micro Amperes.

The amplified current signal is fed from the amplifier 51 to the port I/OC and based on the amplification control status and the data pertaining to the converted analog current signal to digital.

The CPU is programmed to adjust the amplification factor of the amplifier 51 via the I/O A port to obtain the optimum amplification as programmed, commensurate with the received signal to be in mid or most linear range of the sensor specified range.

As shown in FIG. 12 the load 59 is not a pure ohmic or a resistance load, it may be a motor and/or a capacitor and/or a switching power supply commonly used with electrical appliances including PCs. Non ohmic loads cause a shift in phase between the voltage curve and the current curve and/or distort the curve by high power digital switching power loads.

Figure 13:
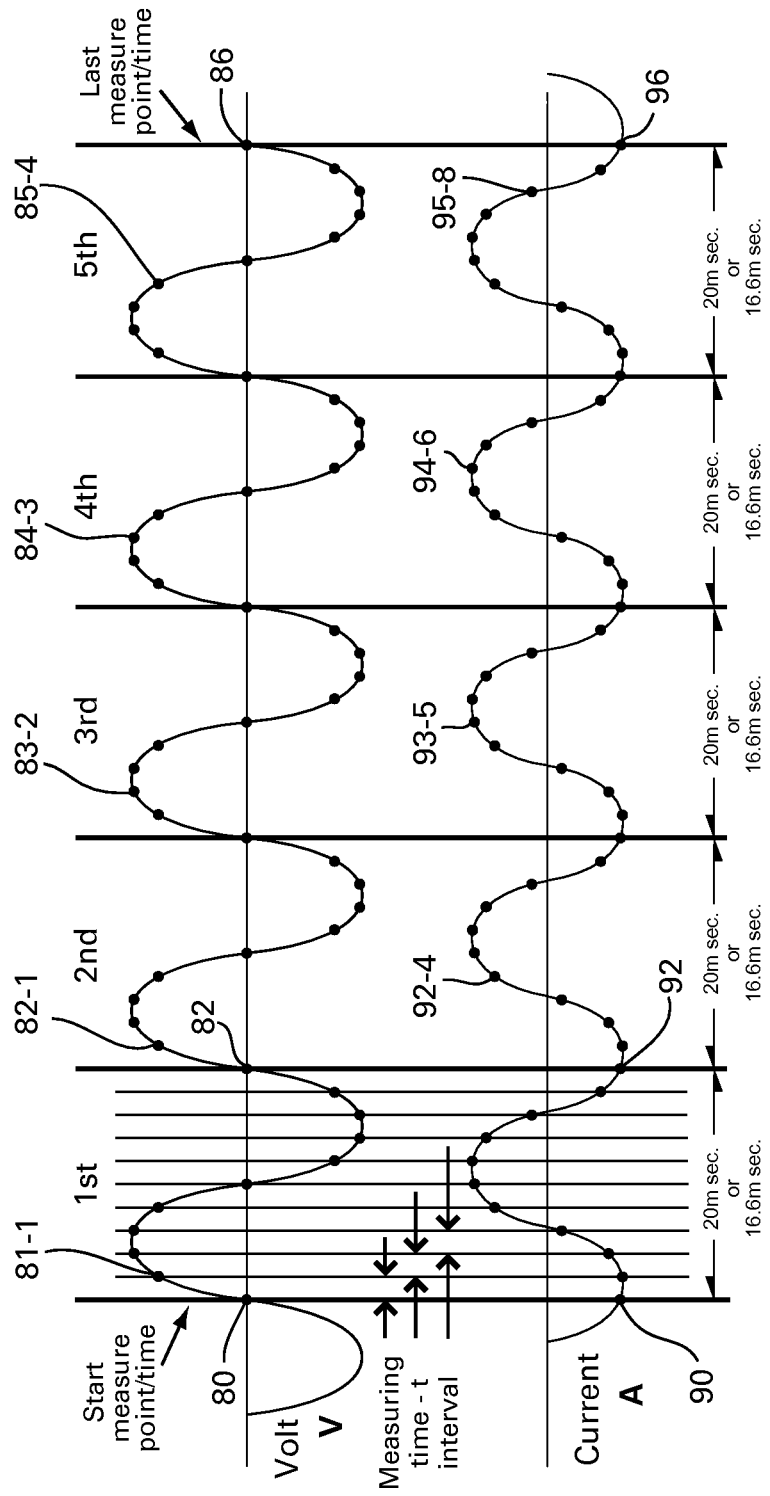
FIG. 13 is an electric graph showing the current versus the voltage phase shifts and the measuring principle for the power consumption calculations.

FIG. 13 shows two sinusoidal curves, the voltage curve 80~86 and the current curve 90~96, which are shifted by a random angle, caused by an unknown RL, LL, and CL load.

The voltage curve 90~96 is curve of a reference voltage fed to the I/OV of the CPU from the neutral AC terminal via a large ohmic divider R1 and R3, with R1 value is in a range such as 0.5~1.0 Mohm and R3 value is few Kohm, to provide an optimum reference signal level representing the power line voltage, the 120V/60 Hz of the US or the 230V/50 Hz of the European power line. The current curve 90~96 is the amplified current signal and an accurate reference of the current drain value.

A zero crossing 80 of the reference voltage curve is the start position or point in time for the processing of power consumption reading. The current phase shift is evident from the deviation of the zero crossing of the current curve.

The zero crossing 80 shown is the cross from negative to positive, at that same time, the start position time 90, the current curve is shown to be close to the peak of the negative curve, or at a phase shift of more than 90°.

The processing shown in FIG. 13 is the measuring of the five reference cycles 81~85 and the phase shifted five current cycles 91~95. The measuring positions or points in time are shown in FIG. 13 as ten points randomly spread over the voltage curve as 81-1, 82-1, 83-2, 84-3 and 85-4 for the voltage points of time, with the exact point of times over the current curve shown as 92-4, 93-5, 94-6 and 95-8. The end of processing positions or point of times is shown as 86 and 96. The shown time interval is 2 mSec for 50 Hz and 16.6 mSec for 60 Hz. The vertical lines divide one cycle into ten points of time, therefore the interval between each point of time is the time duration of one cycle divided by 10.

The time interval or the number of measure points during one cycle (Hz) directly relates to the accuracy of the measurement, same applies to the number of measured AC cycles in one measuring round. Both are a decision to be made, in which higher accuracy require more measured AC cycles (Hz) in one measuring round and a decrease in time intervals or an increase in the number of measuring point.

The power consumption is the product of a calculated sinusoidal V×A graphs created on the basis of the measured values at each point of time simultaneously and summed up per each cycle on the basis of the voltage referenced timing. The shown five cycles 81~85 in FIG. 8 are an example of one round of measurement repeated, for example, every two seconds. When a calculation round is programmed to be carried every two seconds the total of five measured cycles will be multiplied by a factor of 20 for 50 Hz and 24 for 60 Hz (50:5/sec.×2 sec.) or (60:5/sec.×2 sec.). This will represent the power consumed in two seconds.

By the above it should be obvious that the power consumption calculation by the current sensors of the present invention can be simplified and performed by a low cost Central Processing Unit (CPU) or an analog/digital processor both are available from many IC manufacturers. It should be also obvious that the current sensor of the present invention can be made small in size and provide accurate, practical and low cost solution to the power consumption reporting.

The calculated power consumed values are stored and updated in the memory 50A included in the CPU 50 for reporting as programmed to a controller. The calculated power consumption value is converted into a predefined programmed protocol that includes particulars of the load or appliance and the location of load and/or of the AC outlet. The stored and updated data in the memory are coded protocols.

The referenced patents, publications and application, particularly the U.S. Pat. No. 8,170,722 discloses the coding of power consumption protocols and the signal structure of the protocol reporting. The command structure is designed to be short command comprising five bytes only that include all the necessary data for reporting power consumption, the load particulars and its location.

The RF transmitter output measured commonly in micro watt units, does not consume much power, however, it is preferable to minimize the length of the reporting protocols. When any of the shown transceivers, the RF 53, the RFID 55 and the optical 56 are not needed they are not used. RF operating systems may not include the optical transceiver 56, systems operating through optical network may not include the RF transceiver 53 and/or the RFID antennas. Regardless it is possible to include all the circuits and operate wireless, RFID and optical network in parallel or as programmed.

Figure 15:
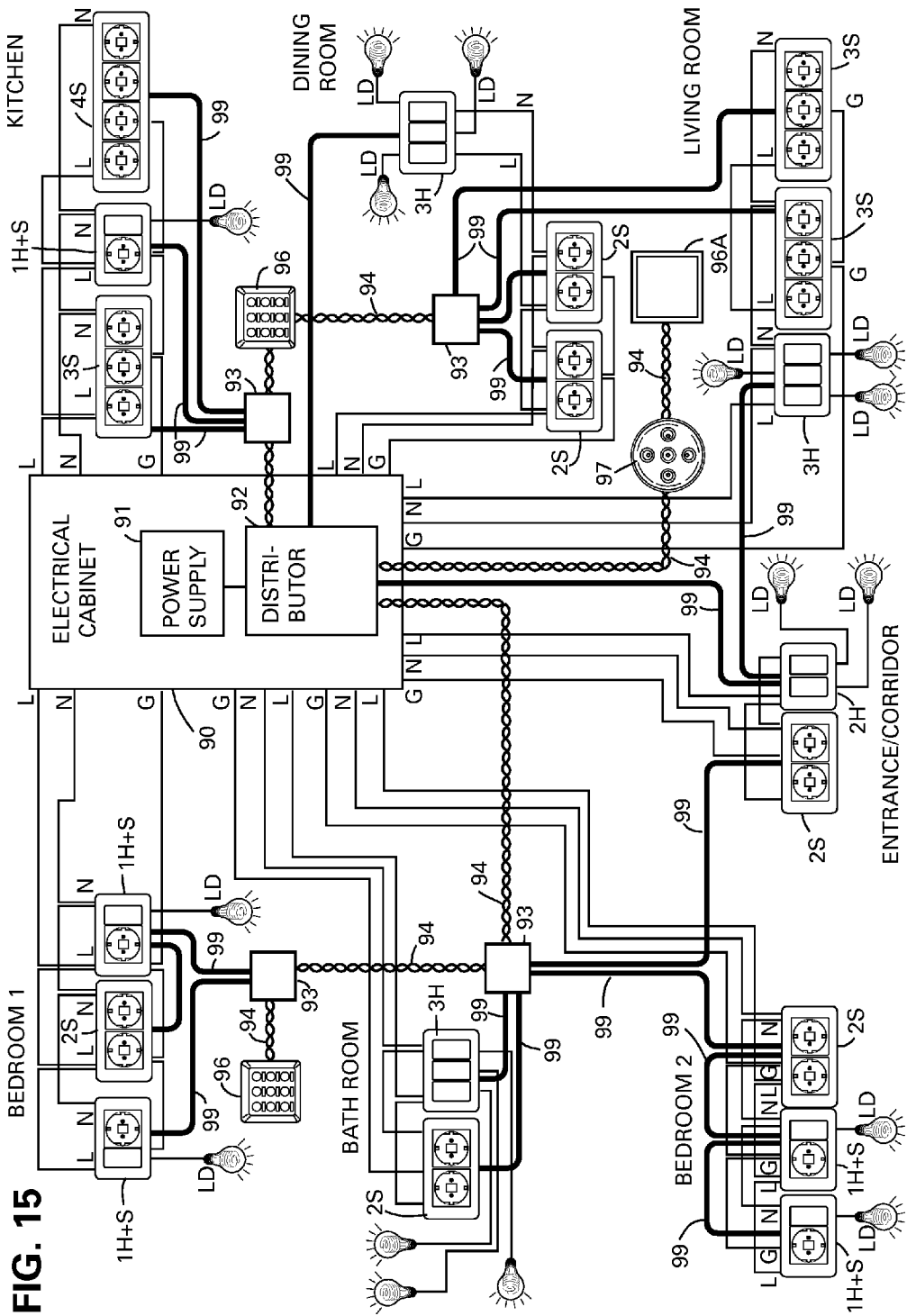
FIG. 15 is an electrical connection and control network showing the interconnections of a typical residence in a high rise building with an automation control throughout and power consumption reporting of the preferred embodiment of the present invention.

Moreover, the optical network of POF mandates the introduction of plurality of optical transceivers for propagating the optical signal in cascade in concert with the optical communications between support boxes and between the support boxes with the power outlets, all being cascaded communications of the optical network of the system as shown in FIG. 15.

The two way buffer 52 is a well known amplifier-buffer, available in small surface mounted IC packages from many semiconductor manufacturers. Its purpose is to interface the signals and their levels and feed the two way signals between the transceivers 53 and 56 to the CPU 50 I/O T and I/O R ports. Depending on the selected CPU and the analog/digital processor 50 there are many such devices that include I/O ports that require no additional buffer as they can be programmed to output and receive varying signals commensurate with the signal exchanged between the CPU and the transceivers. For such devices the two way buffer 52 is not needed and is not used.

The reporting of power consumption to a controller directly or via a network device, such as a current data receiver that receive RF signals or optical signals via an optical cable, must include identifying data. The data should include an identification of the load 59 or the appliance or the type of or the family of the appliance.

The data should further include the location of the appliance within the premise, be it an apartment, or a shop, or a school, or a factory. It is preferred that the data includes the specific identification of the AC outlet, or to which current receiver the outlet is connected or reporting to.

Figure 14A:
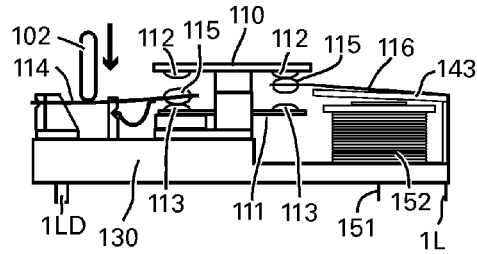
FIGS. 14A and 14B show cut and perspective views of the SPDT hybrid switch-relay combination for introduction into the intelligent support box of the present invention.
Figure 14B:
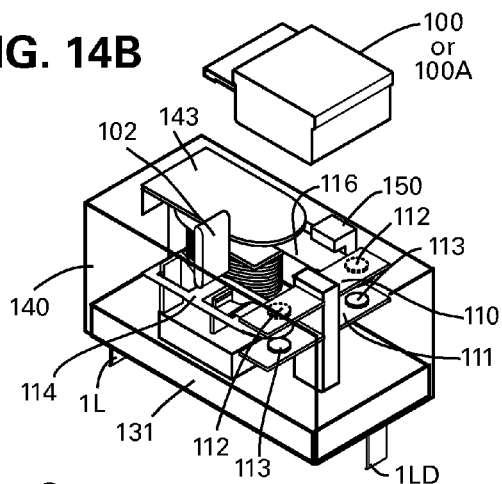

FIGS. 14A and 14B show the SPDT hybrid switch-relay combination in which FIG. 14A is a cut view of the hybrid combination of relay coil 152 magnetically pulling an SPDT pole 116 attached to an armature 143 on one end of a base or a body 130. The other end of the body 130 is a base for an SPDT micro switch pole 114 activated by mechanical plunger 102 to compress the springy structure of the pole 114.

The two "contactors" 110 and 111, as defined in the U.S. patent application Ser. Nos. 14/045,877, 14/093,966 and 14/143,133, link the pole terminals 1L and 1LD via the pole contacts 115 via the contacts 112 and 113. As disclosed in the referenced application dated Oct. 4, 2013, Dec. 9, 2013 and Dec. 30, 2013 respectively, the switching on-off status or connect-disconnect status can be reversed by the micro switch plunger 102 manually or remotely via the relay armature 143 by applying power to the relay coil independently from the manual plunger status or position.

FIG. 14A shows a straight elongated structure of the combined hybrid switch relay with the plunger on one end and the relay coil 152 on the other end. FIG. 14B shows the micro switch pole 114 mounted onto a base or body 131 side by side with the pole 115 linked by the contacts 112, 113 and 115 via perpendicular contactors 110 and 111.

The side by side shortened the length of the hybrid combination into a size for assembly into a casing 140, have a size that conveniently fits the present day manual switches size, as used in the many countries of the world including the US and Japan, using a short, small sizes switches and outlets.

The structure shown in FIG. 14B introduced two more practical advantages, the first is the moving of the plunger 102 toward the center of the casing 140 and the other is the introduction of a mechanical latching push key 100. The latching push key is disclosed in the above reference to US patent applications, based on known technics and structures, and therefore it is not necessary to fully disclose it here. Mechanical latching devices are known, for example, one can view a cabinet door latching device that is locked (latched) or released (open) as a larger example of a very small latching device 15D shown in FIGS. 14B (partially) and 14E. The structures and the details of the latching mechanism are fully disclosed in the referenced US applications.

Another very well known example is the mechanical latching of a ball point pen that is pushed by a push rod or button into writing position and re-pushed or depressed to a release position, so it can be inserted into a shirt pocket without leaving ink mark.

There are two ways to latch the hybrid switch-relay status, one is explained above using the latching key 100 disclosed in the above referenced application, the other is to latch the relay pole 116 using the small latching structure 150. In such case the action to release latched pole must be provided, be it by re-applying power to the relay coil by re-pushing the mechanical switch key. This is discussed below, however when the latching is applied to the relay pole 116, the key 100 should no longer be used and a non-latching push key 100A is used instead.

Figure 14C:
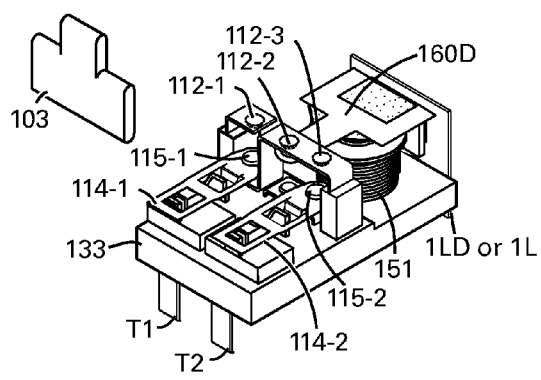
FIG. 14C show perspective views of a DPDT hybrid switch-relay for introduction into the intelligent support of the present invention.
Figure 14D:
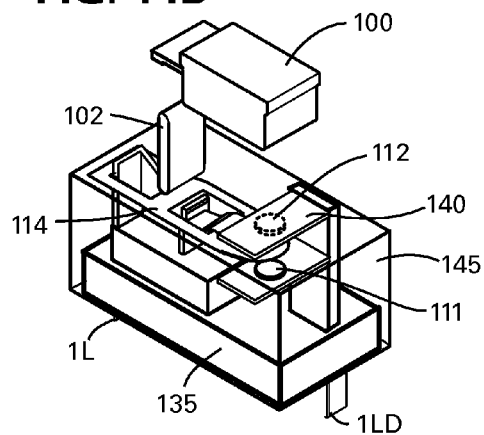
FIG. 14D shows a perspective view of a micro switch with a latching key for introduction into the intelligent support box of the present invention.

FIG. 14C shows dual micro switch poles 114-1 and 114-2 with contact 115-1 and 115-2 and a relay pole 116D mounted onto a base or body 133 and linked via dual reversing contactors, using three sets of contacts 112-1~112-3 and 113-1 to 113-3 (not clearly visible), such that the dual size plunger 103 can manually engage the dual micro switch poles to reverse the polarity of the connected traveler T1 and T2 through the pole 116D of the relay or reverse the pole 116D of the relay to reverse the terminal LD (load terminal) to switch-over from one traveler to the other.

The US patent applications referred to above, fully disclose the reversing and non-reversing DPDT relay-switch combinations and operations, actuated manually via a plunger for operating dual pole micro switch or via a rocker switch, similar to the disclosed actuations for the hybrid SPDT switches, be it via micro switch plunger or via a rocker manual switch structure. Both micro switches and rocker switches are well known and need no further detailed explanations.

The relay coil 151 is operated by applying power to the coil to attract the armature and the pole 116D shown in FIG. 14C, the same way the coil 152 of FIG. 14A is operated, for reversing the T1-T2 connection with the load terminal LD of FIG. 14C.

Further, the US applications referred to above also disclose non-reversing DPDT hybrid switch and relay for use in humid environment, such as in bath rooms and similar locations for connecting or disconnecting both the AC live line L and the AC neutral line N from the power lines.

Even though the self-locking terminals and the receptacles shown in FIGS. 2A to 12 do not show specifically the terminals for introducing a DPDT or reversing DPDT hybrid switch or hybrid switch and relay, receptacles and/or self-locking wire terminals can be introduced into the intelligent support boxes of the present invention, and moreover, any size of such hybrid switches or hybrid switch-relay and/or mechanical switch and/or outlet with or without sensor 40 and/or relay can be accommodated, be it single pole, dual poles or multi poles.

The shown DPDT reversing hybrid switch-relay in FIG. 14C is packaged or encapsulated into an enclosure 141, having a latching key 100 for engaging the plunger 103, including the shown traveler terminals T1 and T2, the load terminal LD and an indicator optical access 160 for introduction into the intelligent support boxes of the present invention.

It is clear and obvious that a reversing mechanical switch, known as four way switch can be structured in the same enclosure 141 with similar push to reverse key or rocker key or any other practical known key, and be introduced into the intelligent support box of the present invention for reversing the polarity of the T1 and T2 traveler connections manually.

It is also clear and obvious that a non-reversing DPDT hybrid switch-relay can be structured and introduced into the intelligent support box of the present invention, the same way as described above for all the other wiring devices including the SPST hybrid switches.

FIG. 14D shows the well known micro switch structured for introduction into the intelligent support box as one type switch for operating a load manually, with no remote operating provisions, a simple manual on-off switch. The shown contact 112 is a dummy contact for providing stop movement to the pole 114.

The key 100 however is providing the latching for the switch, such that the micro switch can be switched on and off by push-push action.

Figure 14E:
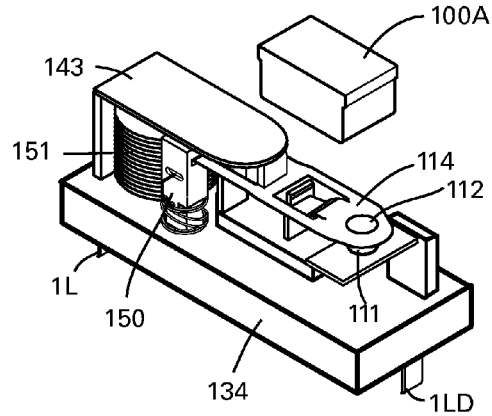
FIG. 14E shows a perspective view of the hybrid switch for introduction into the intelligent support box of the preferred embodiment of the present invention.

The hybrid switch of FIG. 14E is disclosed in the U.S. application Ser. No. 14/143,133 referred to above. The hybrid switch of FIG. 14E does not use a relay pole or contactors. FIG. 14E shows a basic SPST action by a pair of contacts, the fixed contact 111 attached through the body 134 to the load pin 1LD. The moving contact 112 is the contact of the switch pole 114 that connects to the AC live via pin 1L.

The pole 114 is shown to be operated by the armature 143 activated by the magnetic pull of the coil 151. The power applied to the coil during a short time, such as 10-30 mili sec. is sufficient to engage the contacts 111 and 112 and latch the pole by the latching device 150. The latching device 150 latches the pole to the base or the body 134 of the hybrid switch assembly. Reapplying the short power pulse to the coil 151 will re-attract the armature 143 and release the latching state of the pole 114 and disconnect the engagement of the two contacts 111 and 112, thereby reversing or switching off the hybrid switch state, or disconnecting the power fed through the pin 1L to the load pin 1LD.

The hybrid-switch uses a non-latching key 100A that is used to push the armature 143 into latching or release independently from the coil action that is driving the armature 143 by the magnetic pull that does the same thing. This introduced many advantages to the electric systems.

The hybrid switch does not consume continuous relay power beyond the few mili seconds, it does not generate heat, it offers low cost solution to produce the hybrid switch and does not add any costs in assembling and installing the hybrid switch into electrical boxes of the prior art and it is providing the simplest installation for automation of the electrical in factories, hospitals, residences, businesses, public building and the many other buildings having electrical system for light and power other machines and appliances.

FIG. 15 illustrates and shows how simple is the electric system interconnection using the present invention is for a whole residence having two bedrooms, living room, dining room, kitchen, bathroom and entrance/corridor spaces.

This is a typical apartment size of some 100~120 square meter (900~1200 ft). Such size apartment commonly uses a total of 14~16 light switches and some 25~30 outlets.

The shown system of FIG. 15 comprising 30 outlets S and 16 hybrid switches H, installed into 19 intelligent support boxes 2H, 2S, 1H+S, 3H and 3S. The shown POF 99 is estimated to be in length of less than 100 meter (300 ft) and the shown cascading twisted pair is estimated to be less than 50 m or 150 ft.

The automation control and reporting devices connected in the cascaded twist pair lines include four command converters and power consumption receivers 93, two keypad 96 for remote operation, one touch pad 96A and a single relay station/adjustable IR repeater 97, for operating the AV appliances, lights, air conditioner, water boiler and any other remotely controlled electrical devices and appliances in the residence.

The shown electrical wiring connections in FIG. 15 are a fraction of the connections needed and/or applied to the prior art for electrical systems. Particularly those that are introducing automation devices for residences. Moreover, the number of the connection points for the electrical wires L, N and G of the shown system in FIG. 15 are far less, they are a fraction of the connections made in today's new residences, even for system using no remote operation or automation of any kind.

It should be obvious from all the above that the intelligent support boxes of the present invention is an epoch making innovation in the electric wiring field. The intelligent support boxes together with the hybrid switches and outlets, all automated and reporting/identifying full details pertaining the power consumed through each outlet and switch. The new system offers a new horizon for the smart power grid that was awaiting in limbo for the revisit of the present day's electrical systems created during the Edison era.

It should be understood, of course, that the foregoing disclosure relates to only a preferred embodiment of the invention and that it is intended to cover all changes and modifications of the example of the invention herein chosen for the purpose of the disclosure, which modifications do not constitute departures from the scope of the invention.

What is claimed is:

1. A method for setting at least one of home automation grid and network structurally integrated with an electrical grid of one of a residential and a commercial unit via a plurality of intelligent support boxes, each connects to said electrical grid directly and to at least one load via at least one electrical wiring device, said plurality of intelligent support boxes are linked to at least one of a controller and a command converter by one of bidirectional optical signals via one of cascading grid of optical cable and at least one of wireless RF and IR signals bidirectionally propagated in open air; said intelligent support box comprising a CPU, at least one of setting selector and a memory for said setting and for loading particulars data, circuits for operating and for calculating the power consumed by each load via each said wiring device and communication circuits for communicating at least one way of bidirectional signal with said one of controller and command converter via one of said home automation grid and network, said method comprising the steps of: a. loading said particulars data pertaining to each installed intelligent support box as structured including data pertaining to said at least one wiring device into said memory via said communication circuit; b. setting one of identifying numeral and one of a code and address for identifying the installed location within said unit of each of said intelligent support boxes by one of said setting selectors and via said controller or wirelessly via one of an hand held loader and a pad; c. recording into said memory and via said communication circuit and said the at least one of home automation grid and network into at least one of a memory included in said one of controller and command converter the stored particulars and the identified installed location within said unit; and d. identifying each load powered by each said wiring device via one of said setting selectors and a given load identifier stored in the memory of said one of controller and command converter or via one of said hand held loader and a power plug with one of an optical port and an RFID tag mated with a reciprocal optical port and RFID reader respectively accessed via a power outlet of said wiring device attached to said intelligent support box.

2. The method according to claim 1 wherein said grid is one of a low voltage bus-line for propagating electrical signal and an optical grid for propagating at least one of said optical signals via said optical cable including IR signal propagated in line of sight in said open air, said network including propagation of signals comprising said optical signals via said optical cable and said IR signals in line of sight, said electrical signals via bus line, said RF signals and combinations thereof; and said controller is selected from a group comprising a video interphone monitor, a shopping terminal, a dedicated home automation controller, an home automation grid distributor, a key pad, a touch pad, hand held controller and combinations thereof.

3. The method according to claim 2 wherein said optical signal and electrical signal are converted two way for interfacing the propagated optical signal with electric signal and electrical signal with optical signal via one of said command converter and automation grid distributor, and wherein said RF signal and said optical signals are converted two way for interfacing said RF signal with optical signals and said optical signals with RF signals via at least one of said automation grid distributor and said intelligent support box for exchanging signals commensurate with command and response signals of a given load via said automation grid.

4. The method according to claim 1 wherein said bidirectional signals comprising an operate commands for on-off switching and operating at least one given load powered by at least one given electrical wiring device and responses for providing said one of controller and command converter with at least one of data pertaining the status of and one of the current drawn and the power consumed by said at least one given load.

5. The method according to claim 4 wherein a combination of said particulars of a given load powered by a given electrical wiring device, said one of installed location and one of code and address, said operate commands and responses are integrated into integrated control commands stored in said memory and a memory of at least one of said controller and command converter for storing the integrated control commands during the initial setup of the system and upgrade via the controller at random, enabling the propagating of short recall of operate commands and responses via said grid and network and operate said given function of said given load in the given location via a single integrated command and a single integrated response.

6. The method according to claim 5 wherein a specific load powered via said intelligent support box is communicating via one of said RF signal in open air and via one of said optical signal through said optical port and IR in line of sight wherein said specific load is responsive to a specific commands and responses only and, wherein said memory and said memory of said controller and said command converter are updated to include said specific commands and responses and the intelligent support box is further set via said controller to communicate said specific commands and responses with said specific load.

7. Said method according to claim 5 wherein variety of loads powered via said intelligent support box are communicating via one of said RF signal in open air and via one of said optical signal through said optical port and in line of sight wherein said variety of loads are responsive to diverse commands and responses and wherein said memory and said memory of said controller and said command converter are updated to include said diverse commands and responses and the intelligent support box is further set via said controller to communicate with each of said variety of loads only diverse commands and responses, each commensurate with each one of said variety of loads.

8. The method according to claim 1 wherein said intelligent support boxes comprising horizontally oriented boxes diversified in size and capacity and vertically oriented boxes diversified in size and capacity for supporting said electrical wiring devices selected from a group comprising manual switches, hybrid switches, relays, power outlets, power sockets and combinations thereof.

9. The method according to claim 8 wherein said intelligent support box is structured to switch on-off a load directly connected to one of an attached manual switch and an hybrid switch including the switching on-off of a load powered via a given power outlet jointly attached to said intelligent support box for powering a load.

10. The method according to claim 1 wherein said residential and commercial unit is selected from a group comprising a single home, an apartment of a building, one of a room and suit of an hotel, a shop, a restaurant, a club, a given area of a warehouse, an office, a garage, a workshop, one of a class and classes of a school, a library, one of a room and rooms of an hospital, at least one of a room and rooms of a public building, and at least one of area and a zone of a factory.

11. A structurally integrated electrical grid of one of a residential and a commercial unit with at least one of home automation grid and network via plurality of intelligent support boxes each connects to said electrical grid directly and to at least one load via at least one electrical wiring device, said plurality of intelligent support boxes are linked to at least one of a controller and a command converter by one of bidirectional optical signals via one of cascading grid of optical cable and at least one of wireless RF and IR signals bidirectionally propagated in open air; each of said plurality of intelligent support boxes comprising a CPU, at least one of setting selector and a memory for setting the home automation grid and for loading particulars data pertaining to each installed intelligent support box as structured including data pertaining to said at least one wiring device, circuits for operating and for calculating the power consumed by each load via said wiring device and communication circuits for communicating at least one way of bidirectional signal with said at least one of controller and command converter via one of said home automation grid and network; each of said intelligent support box is structured and set to attach at least one of a given wiring devices and is one of preloaded and randomly loaded with said particulars and further comprising a structured current drain sensor for each attached wiring device for said power consumed calculation, said setting including one of an identifying numeral and one of a code and address via said at least one of setting selector or wirelessly via one of an hand held loader and a pad for loading a box identifier to said memory and to the memory of said at least one controller and command converter for recording and identifying each of said intelligent support boxes and their installed location within said unit; and each given load powered via said given wiring device is identified via one of said setting selector and a given load identifier stored in said memory and in the memory of said one of controller and command converter or via one of said hand loader and a power plug with one of optical port and an RFID tag mated with a reciprocal optical port and an RFID reader respectively accessed via a power outlet of said wiring devices attached to said intelligent support box.

12. The structurally integrated electrical grid according to claim 11 wherein said grid is one of a low voltage bus-line for propagating electrical signal and an optical grid for propagating at least one of said optical signals via said optical cable including IR signal propagated in line of sight in said open air, said network including propagation of signals comprising said optical signals via said optical cable and said IR signals in line of sight, said electrical signals via bus line, said RF signals and combinations thereof; and said controller is selected from a group comprising a video interphone monitor, a shopping terminal, a dedicated home automation controller, an home automation grid distributor, a key pad, a touch pad, hand held controller and combinations thereof.

13. The structurally integrated electrical grid according to claim 12 wherein said optical signal and electrical signal are converted two way for interfacing the propagated optical signal with electric signal and electrical signal with optical signal via one of said command converter and an automation grid distributor, and wherein said RF signal and said optical signals are converted two way for interfacing said RF signal with optical signals and said optical signals with RF signals via at least one of said automation grid distributor and said intelligent support box for exchanging signals commensurate with command and response signals of a given load via said automation grid.

14. The structurally integrated electrical grid according to claim 11 wherein said bidirectional signals comprising an operate commands for on-off switching and operating at least one given load powered by at least one given electrical wiring device and responses for providing said one of controller and command converter with at least one of data pertaining the status of and one of the current drawn and the power consumed by said at least one given load.

15. The structurally integrated electrical grid according to claim 14 wherein a combination of said particulars of a given load powered by a given electrical wiring device, said one of installed location and one of code and address, said operate commands and responses are integrated into integrated control commands stored in said memory and a memory of at least one of said controller and command converter for storing the integrated control commands during the initial setup of the system and upgrade via the controller at random, enabling the propagating of short recall of operate commands and responses via said grid and network and operate said given function of said given load in the given location via a single integrated command and a single integrated response.

16. The structurally integrated electrical grid according to claim 15 wherein a specific load powered via said intelligent support box is communicating via one of said RF signal in open air and via one of said optical signal through said optical port and IR in line of sight wherein said specific load is responsive to a specific commands and responses only and, wherein said memory and said memory of said controller and said command converter are updated to include said specific commands and responses and the intelligent support box is further set via said controller to communicate said specific commands and responses with said specific load.

17. Said structurally integrated electrical grid according to claim 15 wherein variety of loads powered via said intelligent support box are communicating via one of said RF signal in open air and via one of said optical signal through said optical port and in line of sight wherein said variety of loads are responsive to diverse commands and responses and wherein said memory and said memory of said controller and said command converter are updated to include said diverse commands and responses and the intelligent support box is further set via said controller to communicate with each of said variety of loads only diverse commands and responses, each commensurate with each one of said variety of loads.

18. The structurally integrated electrical grid according to claim 11 wherein said intelligent support boxes comprising horizontally oriented boxes diversified in size and capacity and vertically oriented boxes diversified in size and capacity for supporting said electrical wiring devices selected from a group comprising manual switches, hybrid switches, relays, power outlets, power sockets and combinations thereof.

19. The structurally integrated electrical grid according to claim 18 wherein said intelligent support box is structured to switch on-off a load directly connected to one of an attached manual switch and an hybrid switch including the switching on-off of a load powered via a given power outlet jointly attached to said intelligent support box for powering a load.

20. The structurally integrated electrical grid according to claim 11 wherein said residential and commercial unit is selected from a group comprising a single home, an apartment of a building, one of a room and suit of an hotel, a shop, a restaurant, a club, a given area of a warehouse, an office, a garage, a workshop, one of a class and classes of a school, a library, one of a room and rooms of an hospital, at least one of a room and rooms of a public building, and at least one of area and a zone of a factory.

\* \* \* \* \*